US011450669B2

(12) United States Patent
Sharma et al.

(10) Patent No.: US 11,450,669 B2
(45) Date of Patent: Sep. 20, 2022

(54) STACKED THIN-FILM TRANSISTOR BASED EMBEDDED DYNAMIC RANDOM-ACCESS MEMORY

(71) Applicant: Intel Corporation, Santa Clara, CA (US)

(72) Inventors: Abhishek A. Sharma, Hillsboro, OR (US); Juan G. Alzate-Vinasco, Tigard, OR (US); Fatih Hamzaoglu, Portland, OR (US); Bernhard Sell, Portland, OR (US); Pei-hua Wang, Beaverton, OR (US); Van H. Le, Beaverton, OR (US); Jack T. Kavalieros, Portland, OR (US); Tahir Ghani, Portland, OR (US); Umut Arslan, Portland, OR (US); Travis W. Lajoie, Forest Grove, OR (US); Chieh-jen Ku, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 910 days.

(21) Appl. No.: 16/043,548

(22) Filed: Jul. 24, 2018

(65) Prior Publication Data
US 2020/0035683 A1 Jan. 30, 2020

(51) Int. Cl.
*H01L 27/108* (2006.01)
*G11C 7/06* (2006.01)
(Continued)

(52) U.S. Cl.
CPC ......... *H01L 27/10805* (2013.01); *G11C 7/06* (2013.01); *G11C 11/407* (2013.01);
(Continued)

(58) Field of Classification Search
CPC .............. H01L 27/10805; H01L 24/17; H01L 25/0657; H01L 27/0688; H01L 27/10885;
(Continued)

(56) References Cited

U.S. PATENT DOCUMENTS

| 5,907,166 A | 5/1999 | Casper et al. |
| 6,143,601 A | 11/2000 | Sun |

(Continued)

FOREIGN PATENT DOCUMENTS

| EP | 3567631 A2 | 11/2019 |
| KR | 20140026894 A | 3/2014 |

(Continued)

OTHER PUBLICATIONS

Non Final Office Action in U.S. Appl. No. 16/474,885 dated Dec. 10, 2020, 17 pages.

(Continued)

*Primary Examiner* — Eduardo A Rodela
(74) *Attorney, Agent, or Firm* — Akona IP

(57) ABSTRACT

Described herein are arrays of embedded dynamic random-access memory (eDRAM) cells that use TFTs as selector transistors. When at least some selector transistors are implemented as TFTs, different eDRAM cells may be provided in different layers above a substrate, enabling a stacked architecture. An example stacked TFT based eDRAM includes one or more memory cells provided in a first layer over a substrate and one or more memory cells provided in a second layer, above the first layer, where at least the memory cells in the second layer, but preferably the memory cells in both the first and second layers, use TFTs as selector transistors. Stacked TFT based eDRAM allows increasing density of memory cells in a memory array having a given footprint area, or, conversely, reducing the footprint area of the memory array with a given memory cell density.

24 Claims, 13 Drawing Sheets

(51) Int. Cl.
  *G11C 11/407* (2006.01)
  *H01L 23/00* (2006.01)
  *H01L 25/065* (2006.01)
  *H01L 27/06* (2006.01)
  *H01L 29/417* (2006.01)
  *H01L 29/786* (2006.01)
  *H01L 27/11* (2006.01)

(52) U.S. Cl.
  CPC .......... *H01L 24/17* (2013.01); *H01L 25/0657* (2013.01); *H01L 27/0688* (2013.01); *H01L 27/10885* (2013.01); *H01L 27/10891* (2013.01); *H01L 29/41733* (2013.01); *H01L 29/7869* (2013.01); *H01L 27/1108* (2013.01)

(58) Field of Classification Search
  CPC ......... H01L 27/10891; H01L 29/41733; H01L 29/7869; H01L 27/1108; H01L 27/016; H01L 27/13; H01L 27/14692; H01L 27/3247; H01L 27/4908; H01L 27/66795; H01L 27/786; H01L 27/7889; H01L 27/78642; H01L 21/707; H01L 29/4908; H01L 29/66795; H01L 29/786; H01L 29/7889; H01L 29/78642; G11C 7/06; G11C 11/407

See application file for complete search history.

(56) References Cited

U.S. PATENT DOCUMENTS

| | | | |
|---|---|---|---|
| 6,208,545 | B1 | 3/2001 | Leedy |
| 6,348,374 | B1 | 2/2002 | Athavale et al. |
| 6,703,661 | B2 | 3/2004 | Wu |
| 9,478,495 | B1 | 10/2016 | Pachamuthu et al. |
| 10,491,209 | B2 | 11/2019 | DiCicco et al. |
| 2001/0006245 | A1 | 7/2001 | Yunogami et al. |
| 2002/0190294 | A1 | 12/2002 | Iizuka et al. |
| 2007/0235792 | A1 | 10/2007 | Kwon et al. |
| 2008/0079050 | A1 | 4/2008 | Tzeng et al. |
| 2008/0083943 | A1* | 4/2008 | Walker .............. H01L 29/78645 257/E21.409 |
| 2011/0089531 | A1 | 4/2011 | Hillman et al. |
| 2012/0012897 | A1 | 1/2012 | Besser et al. |
| 2012/0068335 | A1* | 3/2012 | Song ...................... H05K 1/113 257/737 |
| 2012/0286260 | A1 | 11/2012 | Noda et al. |
| 2013/0070506 | A1 | 3/2013 | Kajigaya |
| 2013/0146868 | A1 | 6/2013 | Zan et al. |
| 2014/0124728 | A1* | 5/2014 | Kim ..................... H01L 27/2463 257/5 |
| 2014/0353662 | A1* | 12/2014 | Shukh ................. H01L 27/2436 257/43 |
| 2015/0014760 | A1* | 1/2015 | Bateman ........... H01L 27/11578 438/269 |
| 2015/0055413 | A1* | 2/2015 | Alsmeier ............. H01L 27/1157 438/106 |
| 2016/0005692 | A1 | 1/2016 | Chandhok et al. |
| 2016/0043137 | A1 | 2/2016 | Lu et al. |
| 2017/0213833 | A1 | 7/2017 | Godo et al. |
| 2017/0271341 | A1* | 9/2017 | Tanaka .............. H01L 27/10897 |
| 2017/0271381 | A1 | 9/2017 | Sone et al. |
| 2018/0033478 | A1 | 2/2018 | Tanaka et al. |
| 2018/0082733 | A1* | 3/2018 | Tanaka ................ G11C 11/4091 |
| 2019/0326296 | A1 | 10/2019 | Wang et al. |
| 2019/0326299 | A1 | 10/2019 | Wang |
| 2019/0393224 | A1 | 12/2019 | Wang et al. |

FOREIGN PATENT DOCUMENTS

| | | |
|---|---|---|
| KR | 20140113428 A | 9/2014 |
| WO | 2018111310 A1 | 6/2018 |
| WO | 2018186835 A1 | 10/2018 |
| WO | 2018186863 A1 | 10/2018 |

OTHER PUBLICATIONS

Extended European Search Report in European Patent Application EP19180720.5 dated Dec. 5, 2019, 8 pages.

International Preliminary Report on Patentability in International Patent Application No. PCT/US2017/025880 dated Oct. 8, 2019, 7 pages.

International Preliminary Report on Patentability in International Patent Application No. PCT/US2017/026300 dated Oct. 8, 2019, 10 pages.

International Search Report and Written Opinion in International Patent Application No. PCT/US2017/026300 dated Dec. 28, 2017, 14 pages.

International Search Report and Written Opinion in International Patent Application No. PCT/US2017/025880 dated Dec. 28, 2017, 9 pages.

Non Final Office Action in U.S. Appl. No. 16/474,885 dated Jul. 2, 2020, 14 pages.

Non Final Office Action in U.S. Appl. No. 15/956,379 dated Aug. 16, 2021, 16 pages.

European Patent Office Action in European Patent Application No. 19161451.0 dated Dec. 22, 2021, 5 pages.

* cited by examiner

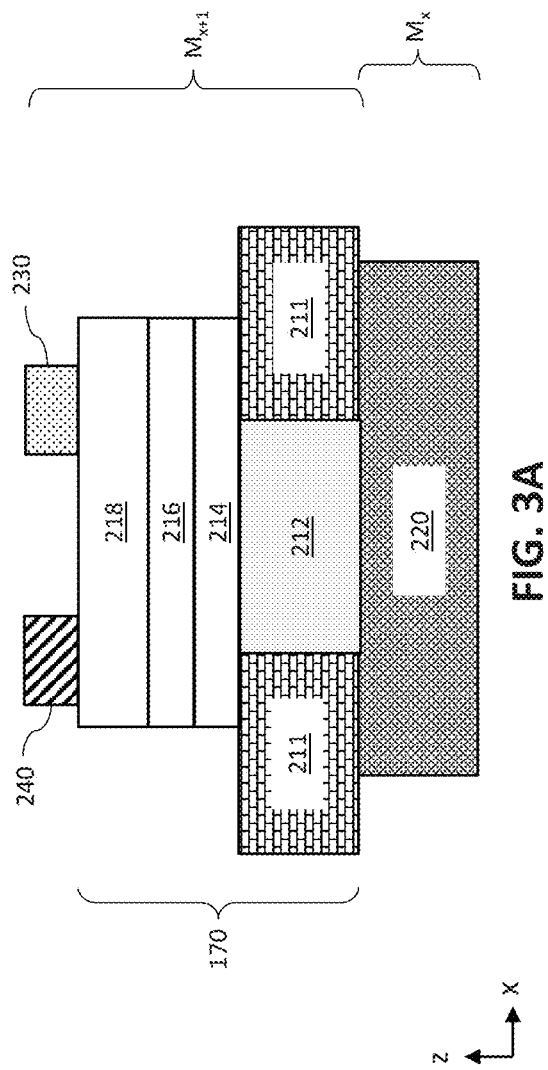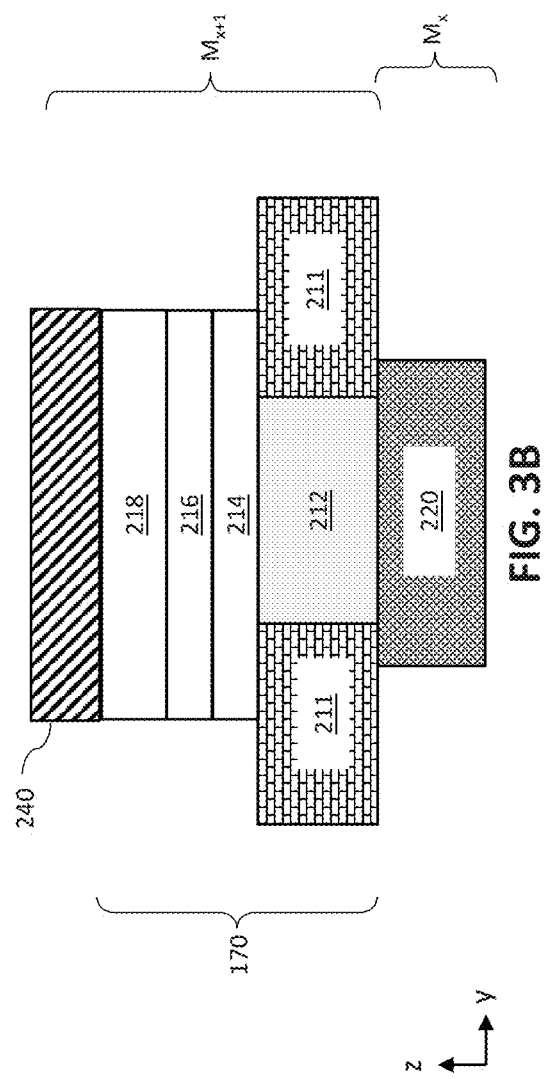

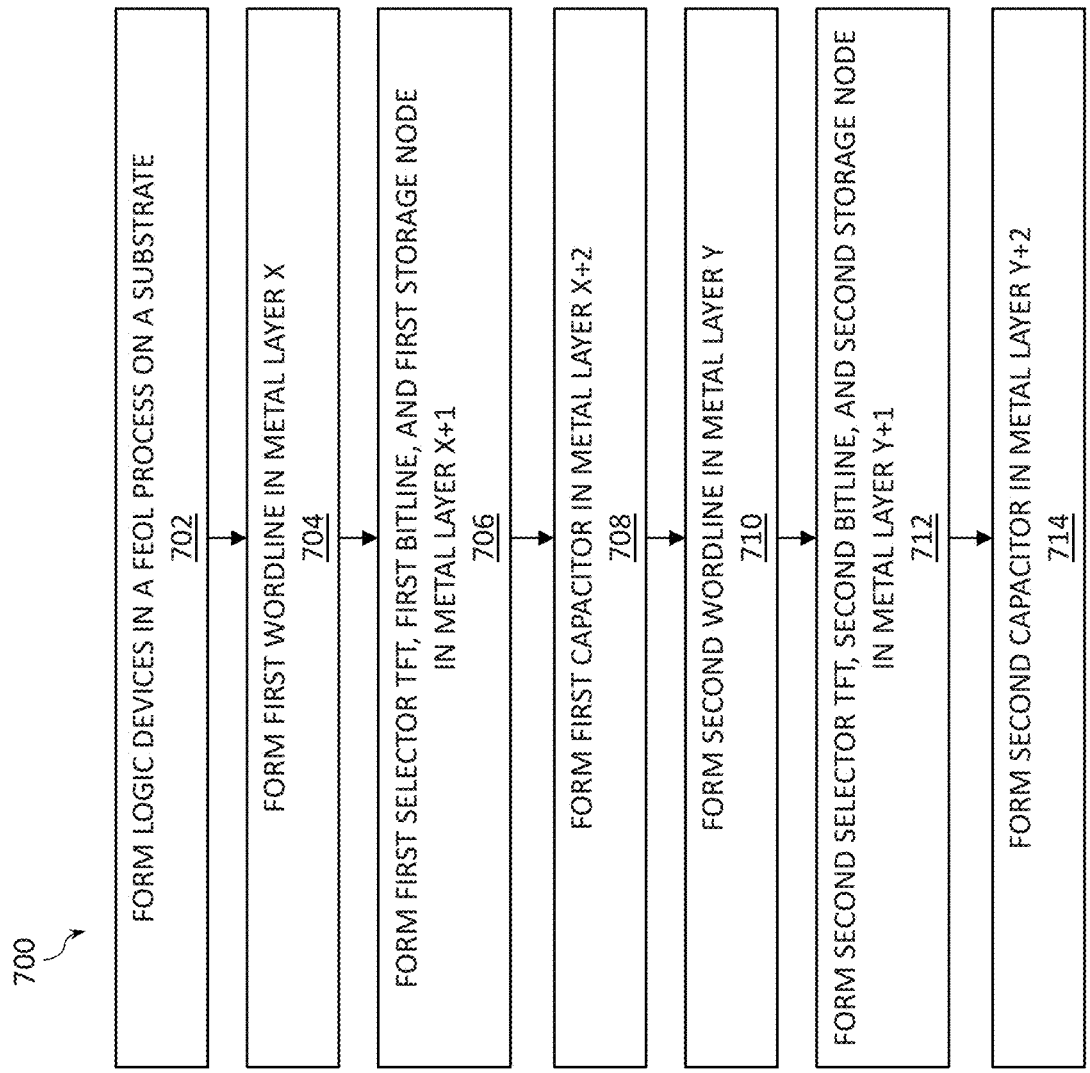

STACKED THIN-FILM TRANSISTOR BASED EMBEDDED DYNAMIC RANDOM-ACCESS MEMORY

BACKGROUND

Embedded memory is important to the performance of modern system-on-a-chip (SoC) technology. Static random-access memory (SRAM) is one example of embedded memory, particularly suitable for modern SoC due to its compatibility with fabrication processes used to manufacture computing logic, e.g., front end of line (FEOL) processes. However, for some applications demanding large on-die cache, such as tens of megabytes (MBs) for handling memory bandwidth, the area and standby power of a SRAM-based cache may pose significant challenges to SoC design. Alternative higher density embedded memory technology, such as dynamic random-access memory (DRAM) and in particular, embedded DRAM (eDRAM), has been introduced to address the limitation in density and standby power of a large SRAM-based cache.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 3A-3B are cross-sectional views of an example structure of the selector TFT in the TFT-eDRAM memory cell of FIGS. 2A-2B, according to some embodiments of the present disclosure.

FIG. 7 illustrates an example method of forming a stacked TFT based eDRAM memory array, according to some embodiments of the present disclosure.

DETAILED DESCRIPTION

Overview

Figure 1:
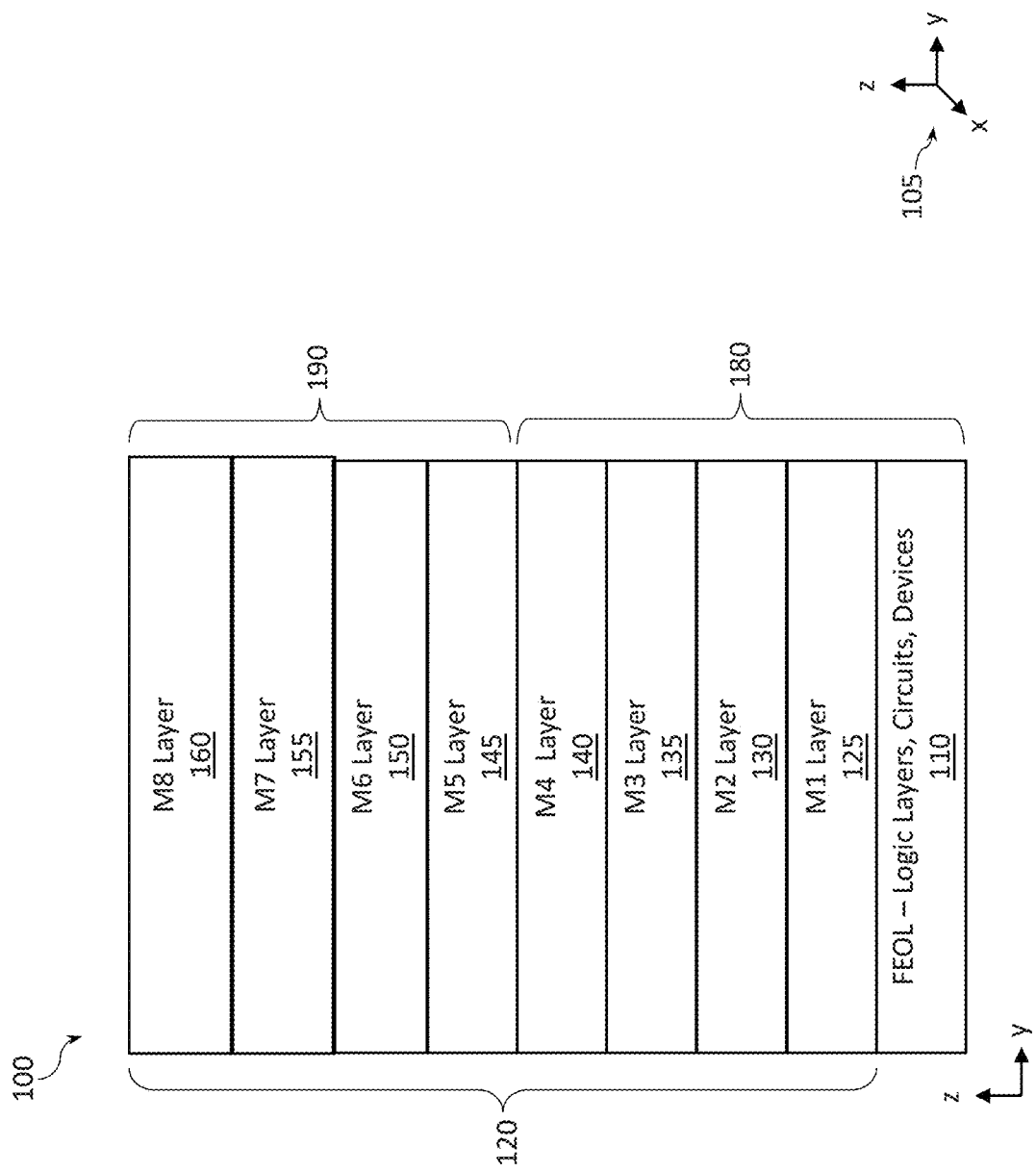
FIG. 1 provides a schematic illustration of a cross-sectional view of an example integrated circuit (IC) device, according to some embodiments of the present disclosure

Some memory devices may be considered "standalone" devices in that they are included in a chip that does not also include computing logic (e.g., transistors for performing processing operations). Other memory devices may be included in a chip along with computing logic and may be referred to as "embedded" memory devices. Using embedded memory to support computing logic may improve performance by bringing the memory and the computing logic closer together and eliminating interfaces that increase latency. Various embodiments of the present disclosure relate to embedded DRAM memory arrays, as well as corresponding methods and devices.

A standard eDRAM memory cell includes a capacitor for storing a bit value, or a memory state (i.e., logical "1" or "0") of the cell, and a selector transistor controlling access to the cell. The capacitor is coupled to one source/drain (S/D) electrode of the selector transistor, while the other S/D electrode of the selector transistor is coupled to a bitline (BL), and a gate electrode of the transistor is coupled to a wordline (WL). Since the eDRAM memory cell can be fabricated with as little as a single selector transistor, eDRAM can provide higher density and lower standby power versus SRAM in the same process technology.

Various eDRAM memory cells have, conventionally, been implemented with selector transistors being FEOL, logic-process based, transistors implemented in an upper-most layer of a semiconductor substrate. Using standard logic transistors as selector transistors of eDRAM creates several challenges.

One challenge relates to the leakage of a selector transistor, i.e., current flowing between the source and the drain of a transistor when the transistor is in an "off" state. Since reducing leakage of logic transistors in the scaled technology is difficult, implementing eDRAM in advanced technology nodes (e.g., 10 nanometer (nm), 7 nm, 5 nm, and beyond) can be challenging. In particular, given a certain selector transistor leakage, capacitance of the capacitor of an eDRAM memory cell should be large enough so that sufficient charge can be stored on the capacitor to meet the corresponding refresh times. However, continuous desire to decrease size of electronic components dictates that the macro area of memory arrays continues to decrease, placing limitations on how large the top area (i.e., the footprint) of a given capacitor is allowed to be, which means that capacitors need to be taller in order to have both sufficiently small footprint area and sufficiently large capacitance. As the capacitor dimensions continue to scale, this in turn creates a challenge for etching the openings for forming the capacitors as tall capacitors with small footprint areas require higher aspect ratio openings, something which is not easy to achieve.

Another challenge associated with the use of logic transistors in eDRAM cell approaches relates to the location of the capacitors such eDRAM cells. Namely, it is desirable to provide capacitors in metal layers close to their corresponding selector transistors. Since logic transistors are implemented as FEOL transistors provided directly on the semiconductor substrate, the corresponding capacitors of eDRAM cells then have to be embedded in lower metal layers in order to be close enough to the logic selector transistors. As the pitches of lower metal layers aggressively scale in advanced technology nodes, embedding the capacitors in the lower metal layers poses significant challenges to the scaling of eDRAM.

Yet another challenge resides in that, given a usable surface area of a substrate, there are only so many FEOL transistors that can be formed in that area, placing a significant limitation on the density of memory cells of a memory array.

Embodiments of the present disclosure may improve on at least some of the challenges and issues described above. In contrast to the eDRAM approaches described above, various embodiments of the present disclosure provide eDRAM cells, arrays, and associated methods and devices, which use TFTs as at least some of selector transistors of eDRAM cells. A TFT is a special kind of a field-effect transistor made by depositing a thin film of an active semiconductor material, as well as a dielectric layer and metallic contacts, over a supporting layer that may be a non-conducting layer. At least a portion of the active semiconductor material forms a channel of the TFT. This is different from conventional, non-TFT, FEOL logic transistors where the active semiconductor channel material is typically a part of a semiconductor substrate, e.g., a part of a silicon wafer. Using TFTs as selector transistors of eDRAM provides several advantages and enables unique architectures that were not possible with conventional, FEOL logic transistors.

One advantage is that a TFT may have substantially lower leakage than a logic transistor, allowing to relax the demands on the large capacitance placed on a capacitor of an eDRAM cell. In other words, using a lower leakage TFT in an eDRAM memory cell allows the eDRAM cell to use a capacitor with lower capacitance and smaller aspect ratio while still meeting the same data retention requirements of other approaches, alleviating the scaling challenges of capacitors.

In addition, selector TFTs may be moved to the back end of line (BEOL) layers of an advanced complementary metal oxide semiconductor (CMOS) process, which means that their corresponding capacitors can be implemented in the upper metal layers with correspondingly thicker interlayer dielectric (ILD) and larger metal pitch to achieve higher capacitance. This eases the integration challenge introduced by embedding the capacitors.

Furthermore, when at least some selector transistors are implemented as TFTs, at least portions of different eDRAM cells may be provided in different layers above a substrate, thus enabling a stacked architecture of eDRAM. In this context, the term "above" refers to being further away from the substrate or the FEOL of an IC device (e.g. the IC device 100 shown in FIG. 1), while the term "below" refers to being closer towards the substrate or the FEOL of the IC device. According to one aspect of the present disclosure, an example stacked TFT based eDRAM device (referred to herein as a "stacked TFT based eDRAM memory array" or simply as a "stacked TFT based eDRAM") includes a substrate and multiple layers stacked over the substrate, where portions of one or more memory cells are provided in a first layer over the substrate and portions of one or more memory cells are provided in a second layer that is above the first layer (i.e., the first layer is between the substrate and the second layer), where at least the memory cells in the second layer, but preferably the memory cells both in the first and second layers, are TFT based eDRAM cells that use TFTs as selector transistors. In various embodiments, the stacked TFT based eDRAM may have further BEOL layers with TFT based eDRAM cells provided therein. Stacked TFT based eDRAM as described herein allows significantly increasing density of memory cells in a memory array having a given footprint area (the footprint area being defined as an area in a plane of the substrate, or a plane parallel to the plane of the substrate, i.e., the x-y plane of an example coordinate system shown in the drawings of the present disclosure), or, conversely, allows significantly reducing the footprint area of the memory array with a given memory cell density.

Still further, by embedding at least some, but preferably all, of the TFT based selector transistors and the corresponding capacitors in the upper metal layers (i.e., in the BEOL layers) according to at least some embodiments of the present disclosure, the peripheral circuits that control the memory operation can be hidden below the memory area to substantially reduce the memory macro array (i.e., the footprint area in the x-y plane of an example coordinate system shown in the FIGS. of the present disclosure). Peripheral circuits of other eDRAM designs account for more than 35% of the total memory macro area, so moving the peripheral circuits below the memory array can substantially reduce the memory footprint area. Other technical effects will be evident from various embodiments described here.

Stacked TFT based eDRAM described herein may be used, for example, to address the scaling challenge of logic transistor (e.g., FEOL) based eDRAM technology and enable high density embedded memory in an advanced CMOS process. In one or more embodiments of the present disclosure, an individual TFT based eDRAM cell may use a low-leakage selector TFT as a row selection transistor (i.e., row selector or selector transistor) and a metal-insulator-metal (MIM) capacitor to store the data (e.g., to store one bit). By using a selector transistor as a TFT embedded in a higher metal layer, e.g., as a TFT with a bottom-gate design or a TFT with a top gate design, the selector transistor may be less susceptible to leakage than if it was formed in the FEOL portion of the IC, and may be provided over a layer of other eDRAM cells.

The systems, methods and devices of this disclosure each have several innovative aspects, no single one of which is solely responsible for the all of the desirable attributes disclosed herein. Details of one or more implementations of the subject matter described in this specification are set forth in the description below and the accompanying drawings.

While some descriptions provided herein refer to stacked TFT based eDRAM utilizing bottom-gate TFT, embodiments of the present disclosure are not limited to only this design and include selector TFTs for different memory cells being of various other architectures, or a mixture of different architectures. For example, in various embodiments, TFTs of various layers of stacked TFT based eDRAM described herein may include bottom-gated TFTs, top-gated TFTs, nanowire TFTs, etc., all of which being within the scope of the present disclosure. Furthermore, using the term "stacked TFT based eDRAM" to refer to a particular IC device that includes stacked TFT based memory cells as described herein does not preclude the IC device from including other types of devices besides memory or other types of memory cells besides eDRAM (or other types of memory cells besides TFT based memory cells). For example, in some embodiments, stacked TFT based eDRAM may also include SRAM memory cells in any of the layers.

In the following detailed description, various aspects of the illustrative implementations may be described using terms commonly employed by those skilled in the art to convey the substance of their work to others skilled in the art. For example, the term "connected" means a direct electrical or magnetic connection between the things that are connected, without any intermediary devices, while the term "coupled" means either a direct electrical or magnetic connection between the things that are connected, or an indirect connection through one or more passive or active intermediary devices. The term "circuit" means one or more passive and/or active components that are arranged to cooperate with one another to provide a desired function. As used herein, a "logic state" (or, alternatively, a "state" or a "bit" value) of a eDRAM cell may refer to one of a finite number of states that the cell can have, e.g., logic states "1" and "0," each state represented by a different voltage of the capacitor of the cell, while "READ" and "WRITE" memory access or operations refer to, respectively, determining/sensing a logic state of a memory cell and programming/setting a logic state of a memory cell. If used, the terms "oxide," "carbide," "nitride," etc. refer to compounds containing, respectively, oxygen, carbon, nitrogen, etc., the term "high-k dielectric" refers to a material having a higher dielectric constant (k) than silicon oxide, while the term "low-k dielectric" refers to a material having a lower k than silicon oxide. The terms "substantially," "close," "approximately," "near," and "about," generally refer to being within +/−20% of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense. For convenience, if a collection of drawings designated with different letters are present, e.g., FIGS. 2A-2B, such a collection may be referred to herein without the letters, e.g., as "FIG. 2."

In the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Various stacked TFT based eDRAM arrangements described herein may be implemented in, or associated with, one or more components associated with an IC or/and may be implemented between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

Example Architecture Considerations

FIG. 1 provides a schematic illustration of a cross-sectional view of an example IC device (e.g., a chip) 100, according to some embodiments of the present disclosure. FIG. 1 illustrates an example coordinate system 105 with axes x-y-z so that the various planes illustrated in FIG. 1 and in some subsequent FIGS. may be described with reference to this coordinate system, e.g., the view shown in FIG. 1 is in the y-z plane, as indicated with y and z axes shown at the lower left corner of FIG. 1. The coordinate system 105 is not shown in subsequent FIGS. in order to not clutter the drawings.

The IC device 100 may be referred to as a stacked TFT based eDRAM arrangement 100 because, as explained below, it will include a TFT based eDRAM memory cells having portions (e.g., selector TFTs) included at least two different layers shown in FIG. 1.

As shown in FIG. 1, the IC device 100 may include an FEOL 110 that includes most of the various logic layers, circuits, and devices to drive and control a logic IC. As also shown in FIG. 1, the IC device 100 also includes a BEOL 120 including, in the example illustration of one embodiment of the present disclosure, seven metal interconnect layers: metal 1 (M1) layer 125, metal 2 (M2) layer 130, metal 3 (M3) layer 135, metal 4 (M4) layer 140, metal 5 (M5) layer 145, metal 6 (M6) layer 150, metal 7 (M7) layer 155, and metal 8 (M8) layer 160. Although eight metal interconnect layers are shown in FIG. 1, in various embodiments, the IC device 100 may include any other number of two or more of such metal interconnect layers. Various metal layers of the BEOL 120 may be used to interconnect the various inputs and outputs of the FEOL 110 and, according to embodiments of the present disclosure, may be used to house different TFT based eDRAM cells.

Generally speaking, each of the metal layers of the BEOL 120, e.g., each of the layers M1-M8 shown in FIG. 1, may include a via portion and a trench/interconnect portion. Typically, the trench portion of a metal layer is above the via portion, which is shown in some cross-section illustration of subsequent figures but, in other embodiments, a trench portion may be provided below a via portion of any given metal layer of the BEOL 120. The trench portion of a metal layer is configured for transferring signals and power along metal lines (also sometimes referred to as "trenches") extending in the x-y plane (e.g., in the x or y directions), while the via portion of a metal layer is configured for transferring signals and power through metal vias extending in the z-direction, e.g., to any of the adjacent metal layers above or below. Accordingly, vias connect metal structures (e.g., metal lines or vias) from one metal layer to metal structures of an adjacent metal layer. While referred to as "metal" layers, various layers of the BEOL 120, e.g., layers M1-M8 shown in FIG. 1, include only certain patterns of conductive metals, e.g., copper (Cu) or aluminum (Al), or metal alloys, or more generally, patterns of an electrically conductive material, formed in an insulating medium such as ILD. The insulating medium may include any suitable ILD materials such as silicon oxide, silicon nitride, aluminum oxide, and/or silicon oxynitride.

As also shown in FIG. 1, the IC device 100 may be further divided into a memory array 190 and a memory peripheral circuit 180. The memory peripheral circuit 180 may be built in the FEOL 110 and lower metal layers of the BEOL 120, e.g., M1-M4 layers, to control (e.g., access (read/write), store, refresh) the memory cells of the memory array 190. The memory array 190 may be a TFT based eDRAM memory array built in higher metal layers of the BEOL 120, e.g., in M5-M8 layers. As such, the memory array 190 may include low-leakage selector TFTs, capacitors, as well as wordlines (e.g., row selectors) and bitlines (e.g., column selectors), making up stacked TFT based eDRAM memory cells as described in greater detail below.

Compared to other eDRAM designs that locate a memory control circuit in the same layers as a memory array but in a different macro (or x-y) area of the integrated circuit than the memory array (such as at a periphery of the memory array), the IC device 100 may advantageously locate the memory peripheral circuit 180 below the memory array 190 (e.g., substantially in the same x-y area), thus saving valuable x-y area in the finished IC. In further detail, the IC device 100 may embed stacked TFT based eDRAM cells in various higher metal layers, e.g., M5, M6, M7, and M8 layers shown in FIG. 1. For example, the M6 layer 150 can contain selector TFTs of one or more of a plurality of first eDRAM cells, while the M8 layer 160 can contain selector TFTs of one or more of a plurality of first eDRAM cells. In some embodiments, bitlines coupled to the selector TFTs of different memory cells may be provided in the same metal layer as such selector TFTs, the bitlines extending in the x-y plane, e.g., in the y direction, to sense/read each of the TFT based eDRAM memory cells (bits) in the selected row and/or to write memory data to any of the memory cells in the selected row. In some embodiments, wordlines coupled to the selector TFTs may be provided in a metal layer below the one containing the selector TFTs, where wordlines can serve as or connect to the gate electrodes or contacts of the selector TFTs. Thus, as explained in greater detail below, for at least some of the stacked TFT based eDRAM cell described herein, a selector TFT can be fabricated above a wordline that may serve as or connect to a gate electrode/contact of the selector TFTs, and below a bitline that may serve as either source or drain (S/D) electrode/contact. For example, a given selector TFT may have a transistor gate below a thin film channel layer, and source and drain contacts above the thin film layer.

In other embodiments of the IC device 100, the memory peripheral circuit 180 and the memory array 190 may occupy other number and/or other metal layers in the BEOL 120 than what is shown in the example of FIG. 1. In still other embodiments of the IC device 100, at least portions of the memory peripheral circuit 180 and the memory array 190 may occupy one or more of the same metal layers in the BEOL 120. In some embodiments of the IC device 100, the memory peripheral circuit 180 and the memory array 190 may be provided in the same one or more metal layers in the BEOL 120.

In some embodiments, the metal gate of the selector TFT in different memory cells in a given row may be connected to a continuous metal line below, such as a copper (Cu)-based metal line, which may provide much lower resistance compared to gate lines formed in the lower (e.g., FEOL) portions of the IC device 100. The continuous metal line may be used as the wordline of the memory array 190, and may be covered by diffusion barriers or diffusion barrier layers including dielectric layers, such as silicon nitride, silicon carbide, or the like, with vias filled with metal-diffusion barrier films like tantalum nitride (TaN), tantalum (Ta), titanium zirconium nitride (e.g., $Ti_xZr_{1-x}N$, such as X=0.53), titanium nitride (e.g., TiN), titanium tungsten (TiW), or the like. A metal gate layer may cover the diffusion barrier film-filled vias, which electrically connect the copper (Cu) wordline to the metal gates of the selector TFTs, the diffusion barrier film preventing or helping to prevent the diffusion or migration of copper (Cu) from the wordline to the rest of the selector TFTs. An active thin film layer (e.g., indium gallium zinc oxide, or IGZO), forming a channel layer of a selector TFT, and then source and drain contacts above the thin film layer may use a metal layer above the metal gate. The space between the source and drain contacts determines the gate length of the selector TFT.

Figure 2A:
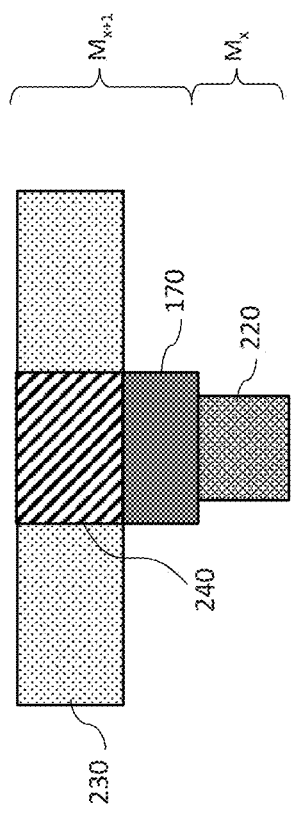
FIGS. 2A-2B are cross-sectional and plan views, respectively, of an example selector thin film transistor (TFT) in a TFT based embedded DRAM (eDRAM) memory cell, according to some embodiments of the present disclosure.
Figure 2B:
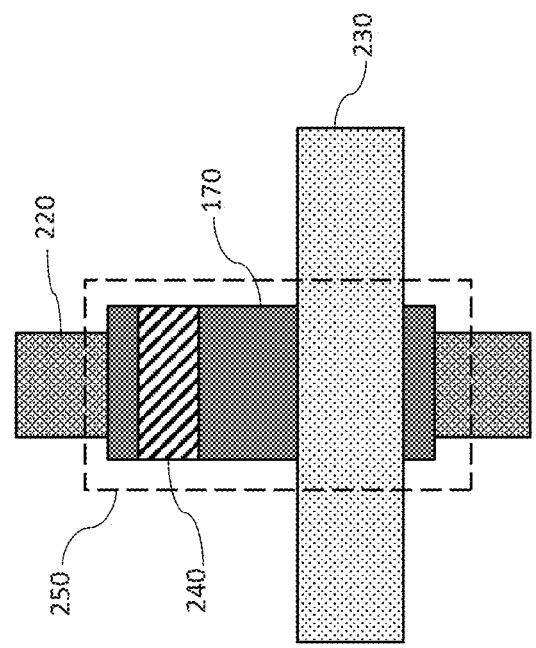

FIGS. 2A-2B are cross-sectional (y-z plane) and plan (y-x plane) views, respectively, of an example selector TFT 170 of a given TFT based eDRAM memory cell 250, according to some embodiments of the present disclosure. FIGS. 3A-3B are cross-sectional views (x-z and y-z planes) of an example structure of the selector TFT in the TFT based eDRAM memory cell of FIGS. 2A-2B, according to some embodiments of the present disclosure. The memory cell 250 shown in FIGS. 2 and 3 is an example of a memory cell that may be implemented, in a stacked architecture (i.e., when different memory cells such as the one shown in FIGS. 2 and 3 are stacked in different layers above a substrate), in a stacked TFT based eDRAM, e.g. the IC device 100.

As shown in FIG. 2, a TFT based eDRAM cell 250 may include a wordline 220 to supply a gate signal, and a selector TFT 170 that includes an channel layer and configured to control transfer of a memory state of the memory cell between a first region and a second region of the channel layer in response to the gate signal (channel layer and first and second regions described in greater detail below, e.g., with reference to FIG. 3), the selector TFT 170 being above the wordline 220 coupled to the memory cell 250. As also shown in FIG. 2, the memory cell 250 may further include a bitline 230 to transfer the memory state and coupled to and above the first region of the channel layer of the selector TFT 170, and a storage node 240 coupled to and above the second region of the channel layer of the selector TFT 170. Although not specifically shown in FIG. 2, the memory cell 250 further includes a capacitor, e.g., an MIM capacitor coupled to and above the storage node 240 and configured to store the memory state of the memory cell 250 (such a capacitor is shown as a capacitor 175 in FIG. 6).

Turning to the details of FIG. 2, the selector TFT 170 in the memory cell 250 may be coupled to or controlled by wordline 220, which, in some embodiments, may serve as the gate of the selector TFT 170. A bitline 230 may be coupled to one of the S/D electrodes (which may also be referred to as "contacts" or "terminals") of the selector TFT 170 and a storage node 240 may be coupled to the other one of the S/D electrodes. As is commonly known, source and drain terminals are interchangeable in transistors. Therefore, while some examples and illustrations may be presented here with reference to the bitline 230 coupled to the drain terminal and the storage node 240 coupled to the source terminal of the selector TFT 170, in other embodiments, this may be reversed. For the following explanations, assume that the bitline 230 may serve as the drain contact and the storage node 240 may serve as the source contact of the selector TFT 170. In some embodiments, the wordline 220 may be formed in a given metal layer of the BEOL 120 of the IC device 100 shown in FIG. 1, e.g., substantially with the same process used to fabricate same metal layer for the rest of the IC device 100, the selector TFT 170 may be formed in the metal layer above that of the wordline 220, e.g., in the via portion of said metal layer, and the storage node 240 and bitline 230 may also be formed in the metal layer above that of the wordline 220, e.g., in the trench portion of said layer. The bitlines 230 can be connected to sense amplifiers and other bitline drivers below the TFT based eDRAM memory array 190. For example, for a first memory cell 250, the wordline 220 may be formed in the M5 layer of the BEOL 120, while the selector TFT 170, the storage node 240, and the bitline 230 may be formed in the M6 layer; while for a second memory cell 250 stacked over the first memory cell, the wordline 220 may be formed in the M7 layer of the BEOL 120, while the selector TFT 170, the storage node 240, and the bitline 230 may be formed in the M8 layer (this is an example illustrated in FIG. 6). In general, for a given memory cell 250, the wordline 220 may be formed in a metal layer $M_x$ of the BEOL 120 (where x is an integer indicating a specific layer), while the selector TFT 170, the storage node 240, and the bitline 230 may be formed in a metal layer $M_{x+1}$, i.e., the metal layer above the metal layer $M_x$, e.g. directly above the metal layer $M_x$ (as illustrated in FIGS. 2 and 3). A capacitor of the memory cell 250, e.g. the capacitor 175 described below, may be formed in a metal layer $M_{x+2}$, e.g. directly above the metal layer $M_{x+1}$ (as illustrated in FIG. 6).

In some embodiments, metal layers in which the memory cells 250 are located, and the associated fabrication techniques, may be customized for the TFT based eDRAM memory array 190 (versus the fabrication of these metal layers and above done outside of the eDRAM) to account for the specialized structures in the TFT based eDRAM memory array 190. For instance, in some embodiments, the metal layers in which the memory cells 250 are located may use a different metal, such as titanium nitride (e.g., TiN) or tungsten (W), than the rest of the metal layers outside of the TFT based eDRAM memory array 190. In some embodiments, the same metal (e.g., copper) may be used for a given metal layer for both inside and outside the TFT based eDRAM memory array 190. Regardless of the choice of metal used to implement the wordline 220, for the storage node 240, and the bitline 230 of any memory cell 250, in various embodiments, the dimensions of these structures can be further modified from those of the rest of the respective layer, e.g., to reduce capacitance of the bitline 230 with the storage nodes 240. For example, in some embodiments particularly advantageous for reducing capacitance, the bitline 230 may be relatively shallow (in the z-direction), e.g., having a thickness (i.e., a dimension measured along the z-axis of the example coordinate system shown in the FIGS.) that is between about 5 and 80 nanometers, including all values and ranges therein, e.g., between about 10 and 50 nanometers, or between about 20 and 35 nanometers.

FIGS. 3A-3B illustrate further details of the selector TFT 170. As shown in FIGS. 3A-3B, the selector TFT 170 may be provided substantially above the wordline 220. The selector TFT 170 may be a bottom-gated TFT in that its gate stack comprising a gate dielectric 216 and a gate electrode 214 may be provided below its channel layer (also referred to as "active layer") 218, e.g., between the channel layer 218 and the FEOL 110, and the channel layer 218 may be between the gate stack and the bitline 230 forming one of the S/D terminals, e.g., the drain terminal, of the selector TFT 170 and the storage node 240 forming another one of the S/D terminals, e.g., the source terminal, of the selector TFT 170 (again, in other embodiments, this example designation of S/D terminals may be reversed). Thus, the wordline 220 may be between the substrate or the FEOL 110 and the gate electrode 214, and the bitline 230 may be further away from the substrate or the FEOL 110 than the channel layer 218.

The channel layer 218 may be composed of semiconductor material systems including, for example, N-type or P-type materials systems. In some embodiments, the channel layer 218 may include a high mobility oxide semiconductor material, such as tin oxide, antimony oxide, indium oxide, indium tin oxide, titanium oxide, zinc oxide, indium zinc oxide, IGZO, gallium oxide, titanium oxynitride, ruthenium oxide, or tungsten oxide. In general, the channel layer 218 may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphite, and black phosphorus, each of which may possibly be doped with one or more of gallium, indium, aluminum, fluorine, boron, phosphorus, arsenic, nitrogen, tantalum, tungsten, and magnesium, etc. In particular, the channel layer 218 may be formed of a thin film material. Some such materials may be deposited at relatively low temperatures, which allows depositing them within the thermal budgets imposed on back end fabrication to avoid damaging the front end components such as the FEOL 110. In some embodiments, the channel layer 218 may have a thickness between about 5 and 30 nanometers, including all values and ranges therein.

The S/D electrodes of the selector TFT 170, shown in various figures as provided by the corresponding bitline 230 and the source node 240, respectively, may include any suitable electrically conductive material, alloy, or a stack of multiple electrically conductive materials. In some embodiments, the S/D electrodes of the selector TFT 170 may include one or more metals or metal alloys, with metals e.g., copper, ruthenium, palladium, platinum, cobalt, nickel, hafnium, zirconium, titanium, tantalum, and aluminum, tantalum nitride, titanium nitride, tungsten, doped silicon, doped germanium, or alloys and mixtures of these. In some embodiments, the S/D electrodes of the selector TFT 170 may include one or more electrically conductive alloys, oxides, or carbides of one or more metals. In some embodiments, the S/D electrodes of the selector TFT 170 may include a doped semiconductor, such as silicon or another semiconductor doped with an N-type dopant or a P-type dopant. Metals may provide higher conductivity, while doped semiconductors may be easier to pattern during fabrication. In some embodiments, the S/D electrodes of the selector TFT 170 may have a thickness (i.e., dimension measured along the z-axis of the example coordinate system shown in the FIGS.) between about 2 nanometers and 1000 nanometers, preferably between about 2 nanometers and 100 nanometers.

A gate dielectric 216 may laterally surround the channel layer 218, and the gate electrode 214 may laterally surround the gate dielectric 216 such that the gate dielectric 216 is disposed between the gate electrode 214 and the channel layer 218. In various embodiments, the gate dielectric 216 may include one or more high-k dielectric materials and may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric 216 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric 216 during manufacture of the selector TFT 170 to improve the quality of the gate dielectric 216. In some embodiments, the gate dielectric 216 may have a thickness between about 0.5 nanometers and 3 nanometers, including all values and ranges therein, e.g., between about 1 and 3 nanometers, or between about 1 and 2 nanometers.

In some embodiments, the gate dielectric 216 may be a multilayer gate dielectric, e.g., it may include any of the high-k dielectric materials in one layer and a layer of IGZO. In some embodiments, the gate stack (i.e., a combination of the gate dielectric 216 and the gate electrode 214) may be arranged so that the IGZO is disposed between the high-k dielectric and the channel layer 218. In such embodiments, the IGZO may be in contact with the channel layer 218, and may provide the interface between the channel layer 218 and the remainder of the multilayer gate dielectric 216. The IGZO may have a gallium to indium ratio of 1:1, a gallium to indium ratio greater than 1 (e.g., 2:1, 3:1, 4:1, 5:1, 6:1, 7:1, 8:1, 9:1, or 10:1), and/or a gallium to indium ratio less than 1 (e.g., 1:2, 1:3, 1:4, 1:5, 1:6, 1:7, 1:8, 1:9, or 1:10).

The gate electrode 214 may include at least one P-type work function metal or N-type work function metal, depending on whether the selector TFT 170 is a P-type metal oxide semiconductor (PMOS) transistor or an N-type metal oxide semiconductor (NMOS) transistor. For a PMOS transistor, metals that may be used for the gate electrode 214 may include, but are not limited to, ruthenium, palladium, platinum, cobalt, nickel, and conductive metal oxides (e.g., ruthenium oxide). For an NMOS transistor, metals that may be used for the gate electrode 214 include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode 214 may include a stack of two or more metal layers, where one or more metal layers are work function metal layers and at least one metal layer is a fill metal layer. Further metal layers may be included for other purposes, such as to act as a diffusion barrier layer, described below.

FIGS. 3A-3B further illustrate that the bottom-gated selector TFT 170 may further, optionally, include layers such as a diffusion barrier layer 212, which may be surrounded by a layer of etch resistant material (e.g., an etch stop layer 211). In some embodiments, the diffusion barrier 212 may be a metal- or copper-diffusion barrier (e.g., a conductive material to reduce or prevent the diffusion of metal or copper from wordline 220 into the gate electrode 214 while still maintaining an electrical connection between the wordline 220 and the gate electrode 214) on the wordline 220 such as TaN, tantalum (Ta), titanium zirconium nitride (e.g., $Ti_xZr_{1-x}N$, such as X=0.53), titanium nitride (e.g., TiN), titanium tungsten (TiW), combination (such as a stack structure of TaN on Ta), or the like. For instance, the diffusion barrier 212 can include a single- or multilayer structure including a compound of tantalum (Ta) and nitrogen (n), such as TaN or a layer of TaN on a layer of Ta. In some embodiments, a layer of etch resistant material (e.g., the etch stop 211) such as silicon nitride or silicon carbide may be formed over the wordline 220 with vias for a metal (or copper) diffusion barrier film 212 such as TaN or a TaN/Ta stack. The gate electrode 214 can be a conductive material on the diffusion barrier 212, such as metal, conductive metal oxide or nitride, or the like. For example, in one embodiment, the gate electrode 214 may be titanium nitride (TiN). In another embodiment, the gate electrode 214 may be tungsten (W).

The channel layer 218 can be in contact with the storage node 240 (e.g., at a first region of the channel layer 218, such as a source region) and with the bitline 230 (e.g., at a second region of the channel layer 218, such as a drain region, with a semi-conductive channel region between the first region and the second region). In some embodiments, such a channel region may include only majority carriers in the thin film. Accordingly, the channel layer 218 may require a relatively high bias (as e.g., supplied by the wordline 220, diffusion barrier film 212, and gate electrode 214) to activate.

As described above, according to various embodiments of the present disclosure, different memory cells 250 may be arranged in different layers above the substrate, e.g., in different layers above the FEOL 110 of the IC device 100, thus realizing a stacked TFT based eDRAM, i.e., a stacked TFT based eDRAM memory array 190. In particular, portions of different memory cells 250 may be arranged in different metal layers of the BEOL 120 of the IC device 100. For example, selector TFTs 170 of a first row of the memory cells 250 may be arranged in a given first metal layer of the BEOL 120, while selector TFTs of a second row of the memory cells 250 may be arranged in a second metal layer above the first metal layer, and so on, with the wordlines 220, bitlines 230, and storage nodes 240 being arranged with respect to the selector TFTs as described herein. Furthermore, in some embodiments, some of the lines may be shared among multiple memory cells, thus enabling more efficient use of space and resources. Two examples of such sharing are illustrated in FIGS. 4 and 5.

Figure 4:
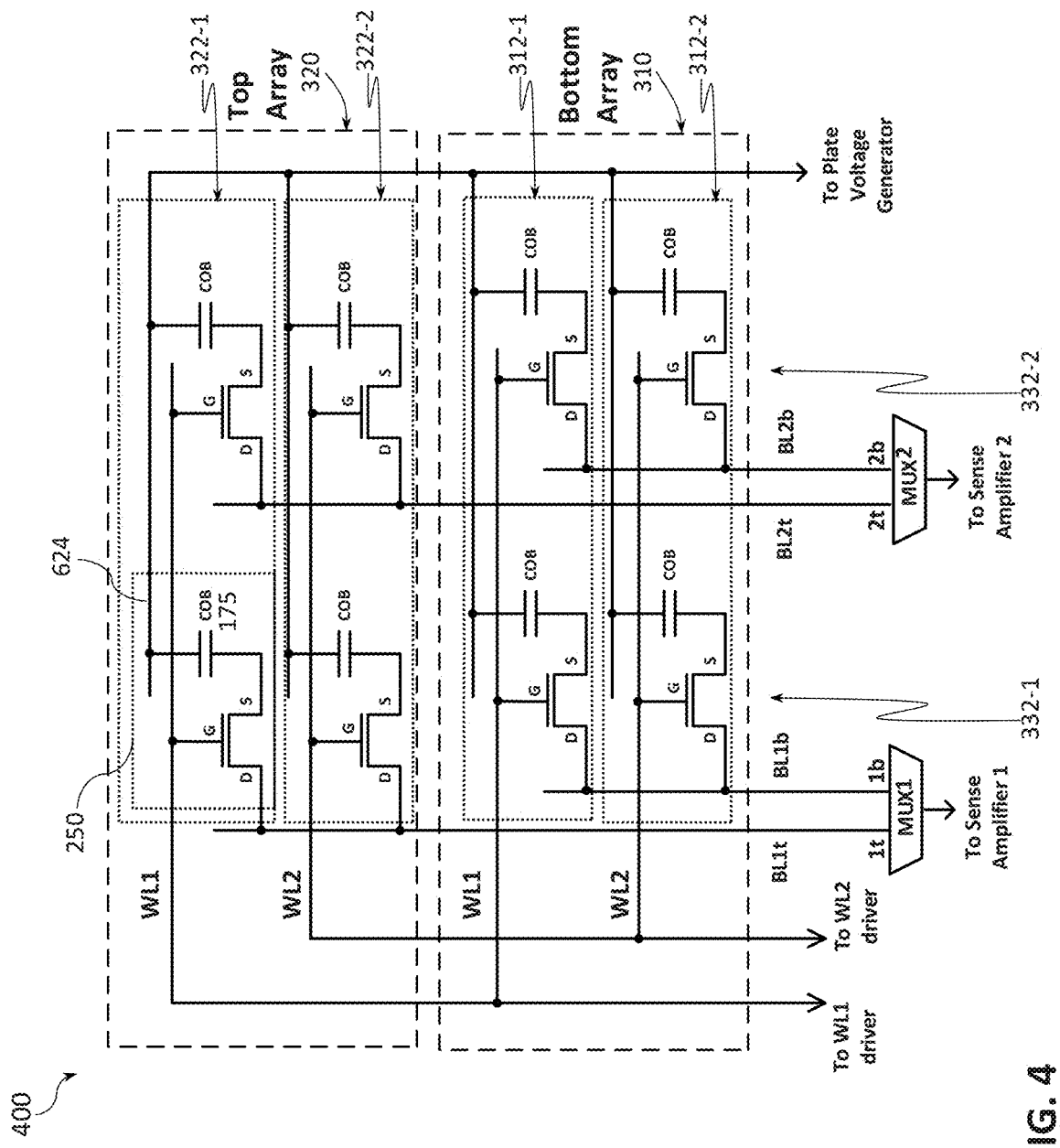
FIG. 4 is a schematic plan of an example configuration of a stacked TFT based eDRAM memory array with shared wordlines, according to some embodiments of the present disclosure.
Figure 5:
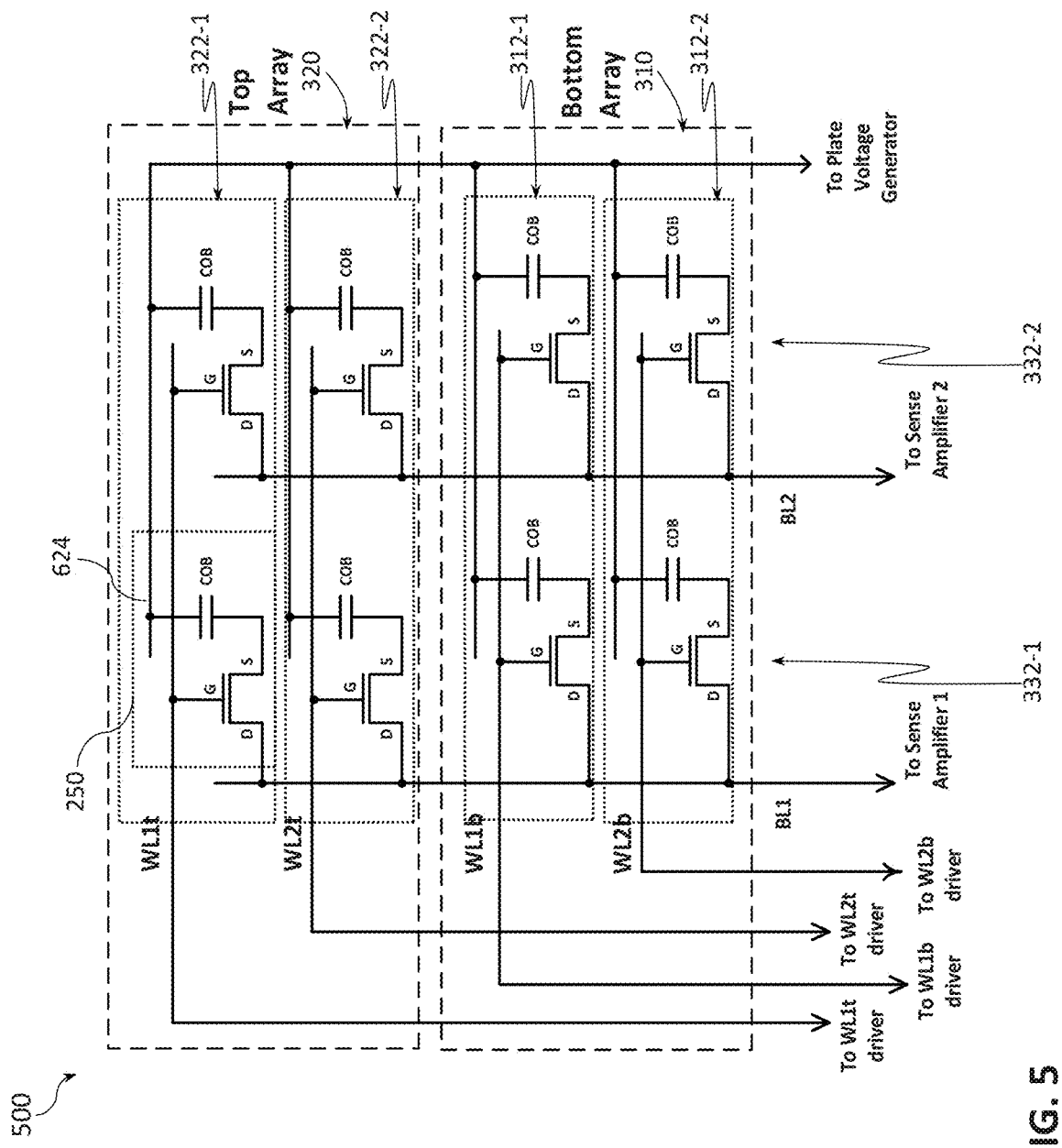
FIG. 5 is a schematic plan of an example configuration of a stacked TFT based eDRAM memory array with shared bitlines, according to some embodiments of the present disclosure.

Each of FIGS. 4 and 5 provides a schematic plan of an example configuration of a stacked TFT based eDRAM memory array, which could be an example implementation of the memory array 190 of the IC device 100. In particular FIG. 4 illustrates an embodiment of a stacked TFT based eDRAM memory array 400 with shared wordlines, while FIG. 5 illustrates an embodiment of a stacked TFT based eDRAM memory array 500 with shared bitlines. Each memory array of FIGS. 4 and 5 illustrates a plurality of memory cells 250, but only one instance of the memory cell 250 is labeled in each of FIGS. 4 and 5 in order to not clutter these FIGS. In particular, a memory array may include memory cells 250 arranged in rows and columns, where different subsets of the memory cells 250 may form sub-arrays that may be stacked in a direction perpendicular to a substrate. For example, FIGS. 4 and 5 illustrate that a memory array may include a bottom array 310 and a top array 320, where the bottom array 310 is provided in a first layer above a substrate and the top array 320 is provided in a second layer above a substrate, above the bottom array 310. Each of the bottom array 310 and the top array 320 may include a plurality of memory cells 250 arranged in rows and columns in an x-y plane. The examples illustrated in FIGS. 4 and 5 show that the bottom array 310 includes a plurality of memory cells 250 arranged in a first row 312-1 and a plurality of memory cells 250 arranged in a second row 312-2 (two memory cells are shown in each of the first and second rows of the bottom array 310 for the example of FIGS. 4 and 5), which memory cells are arranged in a first column 332-1 and a second column 332-2. Similarly, the top array 320 includes a plurality of memory cells 250 arranged in a first row 322-1 and a plurality of memory cells 250 arranged in a second row 322-2 (two memory cells are shown in each of the first and second rows of the top array 320 for the example of FIGS. 4 and 5), which memory cells are arranged in the first column 332-1 and the second column 332-2. Each of the bottom array 310 and the top array 320 may be seen as an array of memory cells 250 arranged in a different x-y plane, thus, together, forming a three-dimensional array of the memory cells 250, extending not only in the x-y plane but also extending in the z-direction because the different x-y plane arrays are stacked on top of one another, e.g., the top array 320 is stacked over (i.e., is at a different z-height than) the bottom array 310. Of course, the number of rows and columns of each of the bottom and top arrays shown in FIGS. 4 and 5 is purely illustrative, and, in other embodiments, any number of rows and columns, each containing any number of one or more memory cells 250 may be used, and, furthermore, additional x-y plane arrays may be stacked over the top array 320.

Each of the memory cells 250 shown in FIGS. 4 and 5 is an example of the memory cell 250 as described above, where gate, drain, and source terminals of a selector TFT 170 of the memory cell 250 are labeled with letters G, D, and S, respectively, and the memory cells 250 shown in FIGS. 4 and 5 further specifically illustrate a capacitor (labeled in FIGS. 4 and 5 as "COB") coupled to one of the S/D terminals of the selector TFT 170 (for the example of FIGS. 4 and 5—the COB is coupled to the source terminal), e.g., via the storage node 240 as described above. As shown in FIGS. 4 and 5, a gate terminal/electrode G of a selector TFT 170 of a given memory cell of FIGS. 4 and 5 is coupled to a wordline, a first S/D terminal (e.g., the source terminal S) of the selector TFT 170 is coupled to a first capacitor electrode of the capacitor COB, a second S/D terminal (e.g., the drain terminal D) of the selector TFT 170 is coupled to a bitline, and a second capacitor electrode of the capacitor COB is coupled to a top plate 624 (also illustrated in FIG. 6). Only one instance of the top plate 624 is labeled in each of FIGS. 4 and 5 in order to not clutter these FIGS., but each row of the memory cells 250, in each of the bottom array 310 and the top array 320, may include a corresponding top plate 624 coupled to the second capacitor electrodes of the capacitor COP in different memory cells 250 of the row. As also shown in FIGS. 4 and 5, the top plates 624 of the different rows of different x-y plane memory arrays, e.g., of both the bottom array 310 and the top array 320, may be coupled to a single shared plate voltage generator (labeled in FIGS. 4 and 5 as "Plate Voltage Generator") configured to generate/apply suitable voltage to the second capacitor plates of the COB capacitors of different memory cells 250.

As further shown in FIGS. 4 and 5, gate terminals/electrodes of a plurality of memory cells 250 in a given row of a particular x-y plane memory array (e.g., the bottom memory array 310 or the top memory array 320) are coupled to a common wordline for that row of that particular x-y plane memory array. Specifically, as shown in FIGS. 4 and 5, gate terminals G of each of the memory cells 250 in the first row 312-1 of the bottom array 310 are coupled to a common first wordline WL1 of the bottom memory array 310, gate terminals G of each of the memory cells 250 in the second row 312-2 of the bottom array 310 are coupled to a common second wordline WL2 of the bottom memory array 310, gate terminals G of each of the memory cells 250 in the first row 322-1 of the top memory array 320 are coupled to a common first wordline WL1 of the top memory array 320, and gate terminals G of each of the memory cells 250 in the second row 322-2 of the top memory array 320 are coupled to a common second wordline WL2 of the top memory array 320. As also shown in FIGS. 4 and 5, one of the S/D terminals/electrodes of a plurality of memory cells 250 in a given column of a particular x-y plane memory array (e.g., the bottom memory array 310 or the top memory array 320) are coupled to a common bitline for that column of that particular x-y plane memory array. Specifically, as shown in FIGS. 4 and 5, drain terminals D of each of the memory cells 250 in the first column 332-1 of the bottom array 310 are coupled to a common first bitline BL1 of the bottom memory array 310, drain terminals D of each of the memory cells 250 in the second column 332-2 of the bottom array 310 are coupled to a common second bitline BL2 of the bottom memory array 310, drain terminals D of each of the memory cells 250 in the first column 332-1 of the top memory array 320 are coupled to a common first bitline BL1 of the top memory array 320, and drain terminals D of each of the memory cells 250 in the second column 33-2 of the top memory array 320 are coupled to a common second bitline BL2 of the top memory array 320. The differences between arrangements of FIG. 4 and FIG. 5 arise from how different wordlines and bitlines of different x-y plane memory arrays may be shared.

In particular, the stacked TFT based eDRAM memory array 400 of FIG. 4 illustrates an embodiment where memory cells in different layers above a substrate may be coupled to a shared wordline, which shared wordline is driven by a single shared wordline driver. In particular, in "shared wordline" embodiments, a common wordline coupled to gate terminals of a plurality of memory cells 250 in a given row i (where i is an integer representing a row in an x-y plane memory array) of one x-y plane memory array may be coupled to a common wordline coupled to gate terminals of a plurality of memory cells 250 in a corresponding row i of another x-y plane memory array of a stacked TFT based eDRAM memory array, thus the common wordlines of a given row i are shared between different x-y plane memory arrays by being coupled to a single wordline driver. This is shown in FIG. 4 with a common wordline WL1 coupled to gate terminals of a plurality of memory cells 250 in the first row 312-1 of the bottom memory array 310 being coupled to a common wordline WL1 coupled to gate terminals of a plurality of memory cells 250 in the first row 322-1 of the top memory array 320, these two common wordlines (i.e., WL1 of the bottom memory array 310 and WL1 of the top memory array 320) being shared between the bottom and top memory arrays 310, 320 by being coupled to a single wordline driver WL1. Similarly for the second rows shown in FIG. 4, the shared wordline embodiment is shown in FIG. 4 with a common wordline WL2 coupled to gate terminals of a plurality of memory cells 250 in the second row 312-2 of the bottom memory array 310 being coupled to a common wordline WL2 coupled to gate terminals of a plurality of memory cells 250 in the second row 322-2 of the top memory array 320, these two common wordlines (i.e., WL2 of the bottom memory array 310 and WL2 of the top memory array 320) being shared between the bottom and top memory arrays 310, 320 by being coupled to a single wordline driver WL2.

FIG. 4 further illustrates, that, in some "shared wordline" embodiments, a common bitline coupled to S/D terminals of a plurality of memory cells 250 in a given column j (where j is an integer representing a column in an x-y plane memory array) of one x-y plane memory array may be coupled to one input/output (I/O) port of a multiplexer coupled to a sense amplifier, and a common bitline coupled to S/D terminals of a plurality of memory cells 250 in the corresponding column j of another x-y plane memory array of a stacked TFT based eDRAM memory array may be coupled to another I/O port of the multiplexer, thus a single sense amplifier may be shared by being multiplexed between the common bitlines of a given column j of different x-y plane memory arrays. This is shown in FIG. 4 with a common bitline BL1b (where the letter "b" stands for "bottom" as in "bottom array 310") coupled to drain terminals of a plurality of memory cells 250 in the first column 332-1 of the bottom memory array 310 being coupled to a first I/O port (labeled "1b") of a first multiplexer MUX1, and a common bitline BL1t (where the letter "t" stands for "top" as in "top array 320") coupled to drain terminals of a plurality of memory cells 250 in the first column 332-1 of the top memory array 320 being coupled to a second I/O port (labeled "1t") of the first multiplexer MUX1, with the first multiplexer MUX1 coupled to a first sense amplifier (labeled in FIG. 4 as a "Sense Amplifier 1"). Similarly for the second columns shown in FIG. 4, a common bitline BL2b coupled to drain terminals of a plurality of memory cells 250 in the second column 332-2 of the bottom memory array 310 is coupled to a first I/O port (labeled "2b") of a second multiplexer MUX2, while a common bitline BL2t coupled to drain terminals of a plurality of memory cells 250 in the second column 332-2 of the top memory array 320 is coupled to a second I/O port (labeled "2t") of the second multiplexer MUX2, with the second multiplexer MUX2 coupled to a second sense amplifier (labeled in FIG. 4 as a "Sense Amplifier 2").

Although not specifically illustrated in FIG. 4, in some embodiments of the "shared wordline" arrangement as described with reference to the stacked TFT based eDRAM memory array 400, memory cells of the top array 320 may, optionally, be interleaved with memory cells of the bottom array 310 to allow reduced area for bitline landing from the same edge of an array. Thus, when projected on a given x-y plane (i.e., a plane parallel to the substrate), projections of memory cells 250 in the bottom array 310 may be offset (not co-centered) with projections of memory cells 250 in the top array 320.

Turning to FIG. 5, the stacked TFT based eDRAM memory array 500 of FIG. 5 illustrates an embodiment where memory cells in different layers above a substrate may be coupled to a shared bitline, which shared bitline is, in turn, coupled to a single shared sense amplifier. In particular, in "shared bitline" embodiments, a common bitline coupled to S/D terminals of a plurality of memory cells 250 in a given column j of one x-y plane memory array may be coupled a common bitline coupled to S/D terminals of a plurality of memory cells 250 in the corresponding column j of another x-y plane memory array, and both of the common bitlines may be coupled to a single sense amplifier which can, thereby, be shared between the common bitlines of a given column j of different x-y plane memory arrays. This is shown in FIG. 5 with a common bitline BL1 coupled to drain terminals of a plurality of memory cells 250 in the first column 332-1 of the bottom memory array 310 and a common bitline BL1 coupled to drain terminals of a plurality of memory cells 250 in the first column 332-1 of the top memory array 320 both being coupled to a first sense amplifier (labeled in FIG. 5 as a "Sense Amplifier 1"). Similarly for the second columns shown in FIG. 5, a common bitline BL2 coupled to drain terminals of a plurality of memory cells 250 in the second column 332-2 of the bottom memory array 310 and a common bitline BL2 coupled to drain terminals of a plurality of memory cells 250 in the second column 332-2 of the top memory array 320 are both coupled to a second sense amplifier (labeled in FIG. 5 as a "Sense Amplifier 2").

What is also shown in FIG. 5 is that, in some of the "shared bitline" embodiments, memory cells of different x-y plane memory arrays may be read/programmed individually by using separate wordline drivers. This is shown in FIG. 5 with a common wordline WL1b coupled to gate terminals of a plurality of memory cells 250 in the first row 312-1 of the bottom memory array 310 being coupled to a wordline driver labeled in FIG. 5 as a "WL1b driver," a common wordline WL1t coupled to gate terminals of a plurality of memory cells 250 in the first row 322-1 of the top memory array 320 being coupled to a wordline driver labeled in FIG. 5 as a "WL1t driver," a common wordline WL2b coupled to gate terminals of a plurality of memory cells 250 in the second row 312-2 of the bottom memory array 310 being coupled to a wordline driver labeled in FIG. 5 as a "WL2b driver," and a common wordline WL2t coupled to gate terminals of a plurality of memory cells 250 in the second row 322-2 of the top memory array 320 being coupled to a wordline driver labeled in FIG. 5 as a "WL2t driver."

Applicable to both FIGS. 4 and 5, individual memory cells 250 are provided at crossing regions of wordlines 220 and bitlines 230 (e.g., each memory cell 250 being driven by a unique pair of wordline 220 and bitline 230), each memory cell 250 including a selector TFT 170 shown in FIGS. 4 and 5 by its' terminals G, D, and S, and a capacitor COB, e.g., a MIM capacitor 175 as shown in FIG. 6. Each wordline may be driven by a corresponding wordline driver to which the wordline is coupled to, while the corresponding bitlines 230 are pre-charged to a set or predetermined voltage, and then the charge in the MIM capacitor 175 of each of the corresponding bits of the selected wordline 220 may be sensed by a sense amplifier to which the bitline is coupled to. In addition, although not specifically shown in FIGS. 4 and 5, a reference column of memory cells may provide a corresponding reference signal (e.g., halfway between a logic low value and a logic high value) over a reference bitline substantially concurrently with the sensing of the desired bit on the bitline 230. These two values may be compared, e.g., by a sense amplifier to which a given bitline 230 is coupled to, which may be configured to determine whether the desired bit or memory cell is a logic high value (e.g., 1) or a logic low value (e.g., 0).

The memory cells 250 of the stacked TFT based eDRAM memory arrays 400 and 500 shown in FIGS. 4 and 5 may be included in the memory array 190 shown in FIG. 1, and may be embedded in the BEOL layers 120 of the IC device 100 shown in FIG. 1. In particular, the bottom array 310 shown in FIGS. 4 and 5 may be provided in one or more BEOL layers 120, while the top array 320 may be provided in one or more BEOL layers 120 which, overall, extend further away from the substrate than the one or more BEOL layers 120 that house the bottom array 310.

Figure 6A:
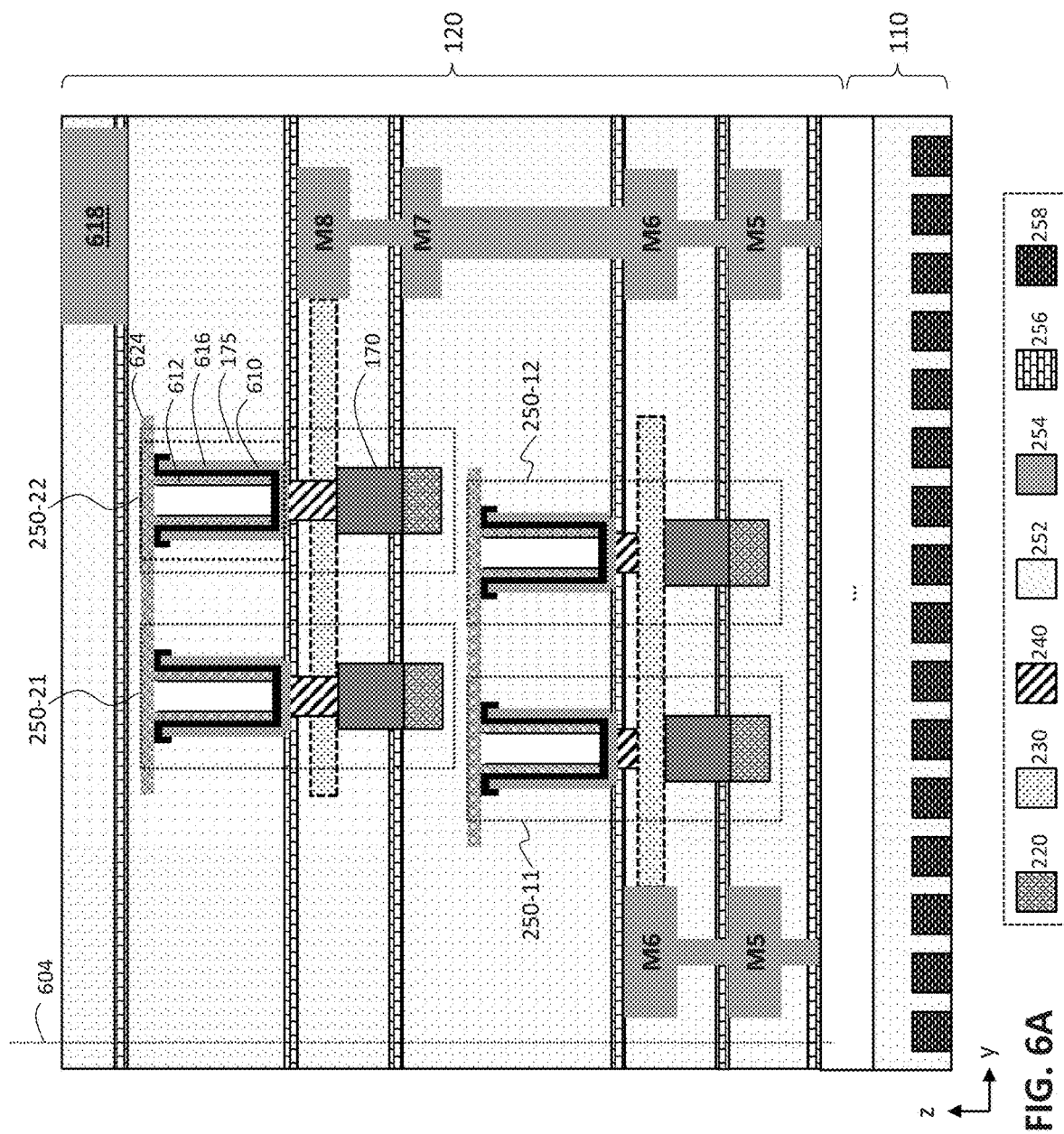
FIGS. 6A-6B are different cross-sectional (y-z and x-z) views of an example IC device implementing a stacked TFT based eDRAM memory array with shared wordlines, according to some embodiments of the present disclosure.
Figure 6B:
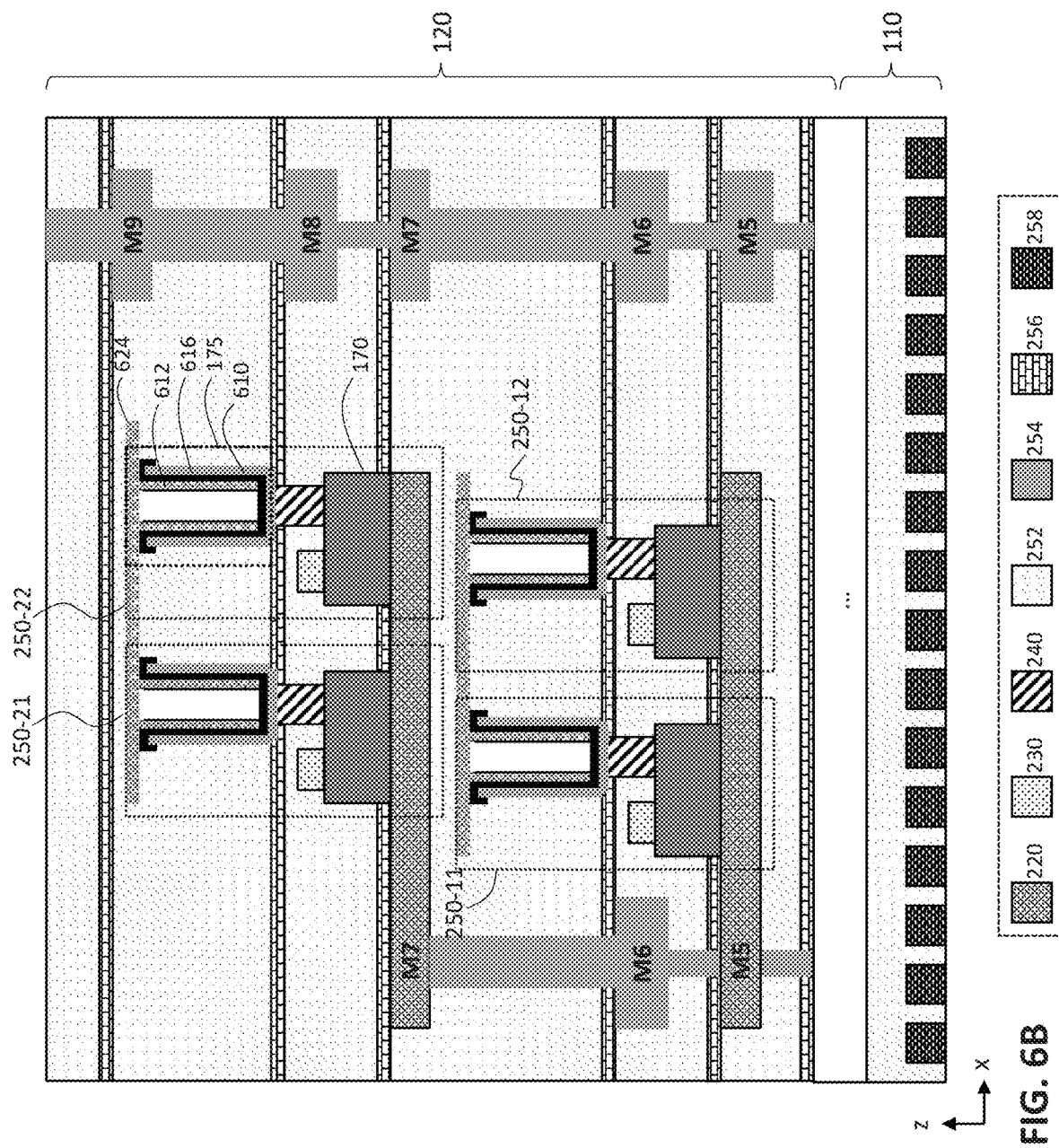

FIGS. 6A and 6B are different cross-sectional (y-z and x-z, respectively) views of an example IC device implementing a stacked TFT based eDRAM memory array with shared wordlines, e.g., the IC device 100 implementing, e.g., the memory array 190, which array may take on any embodiment of the stacked TFT based eDRAM memory array 400 or 500, according to some embodiments of the present disclosure. In these FIGS., reference numerals from previous FIGS. are intended to illustrate analogous or similar elements and, therefore, in the interests of brevity, their description is not repeated. A number of elements referred to in the description of FIGS. 6A-6B are indicated in these figures with different patterns in order to not clutter the drawings, with a legend at the bottom of such figures (enclosed in a dashed rectangle) showing the correspondence between the reference numerals and the patterns.

FIG. 6A illustrates the FEOL 110 and various BEOL 120 metal layers, where the lower BEOL layers are not shown specifically (illustrating a break in the drawing between the FEOL 110 and the BEOL 120 with three dots), but only upper layers M5-M9 are shown. Reference numeral 252 shown in some of the metal layers illustrates an insulating material in which metal lines and vias for providing electrical connectivity are provided, where the insulating material 252 may be e.g., any of the ILD materials described herein.

A vertical dotted line 604 shown in FIG. 6A may represent an imaginary boundary between an embodiment of components of a stacked TFT based eDRAM memory array 190 being on one side of the line (in the example of FIG. 6A, to the right of the line 604), and components of a regular logic IC being on the other side of the line (in the example of FIG. 6A, to the left of the line 604). In other embodiments, components of a regular logic IC could be implemented under the memory array 190, i.e., in the FEOL 110 and lower BEOL 120 layers.

To the right of the line 604, an example stacked TFT based eDRAM memory array, e.g., memory array 190, is shown in FIG. 6A, illustrating two example TFT based eDRAM memory cells, e.g., memory cells 250 described above, in a first layer above the FEOL 110, labeled as cells 250-11 and 250-12, and illustrating two example cells in a second layer above the FEOL 110, labeled as cells 250-21 and 250-22. Together, the cells 250-11, 250-12, 250-21, and 250-22 can still be referred to as the memory cells 250, described above, each of which showing a selector TFT 170 and a capacitor 175, as described above. The individual parts of the capacitor 175 are labeled only for one of the memory cells 250 shown in FIG. 6A, namely, for the memory cell 250-22, in order to not clutter the drawing by repeating this labeling for all other memory cells 250 shown. The individual parts of the selector TFT 170 are not shown in order to not clutter the drawing and since they were described with reference to FIGS. 2A-2B and FIGS. 3A-3B. In accordance with these descriptions, FIG. 6A illustrates that each of the TFTs 170 shown is a bottom-gated TFT having a respective wordline 220 coupled/connected to its' gate electrode (which, as described above, could mean that the respective wordline 220 is forming the gate electrode of the TFT 170), and having the storage node 240 connected to (or forming) one of its' S/D electrodes and having the bitline 230 connected to (or forming) the other. The bitline 230 is shown as surrounded by a dashed line in order to illustrate that it is in a different plane than the plane of the drawing (e.g., behind and parallel to the plane of the drawing) shown in FIG. 6A.

As shown in FIG. 6A, the capacitor 175 of each of the memory cells 250 may be a MIM capacitor having a first, or bottom, electrode 610 and a second, or top electrode 612, the two electrodes separated by a dielectric material 616 (the dielectric 616 shown in FIG. 6A in black). The top electrodes 612 of the different memory cells 250 are connected/coupled to the top plate 624, as described above with reference to FIGS. 4 and 5.

Each storage node 240 of the selector TFTs 170 in different memory cells 250 in a given layer of memory cells 250 may be connected to a MIM capacitor 175 above, e.g., to the bottom electrode 610 of the MIM capacitor 175. In some embodiments, as shown in FIG. 6A, the MIM capacitor 175 may be fabricated in one metal layer, while the storage node 240, the bitline 230, and the selector TFT 170 may be fabricated in a lower metal layer, with the wordline 220 being fabricated in yet another metal layer, below that of the selector TFT 170.

In some embodiments, the MIM capacitor 175 may be fabricated by etching (for example, by photolithography) deep, narrow openings (e.g., trenches) in the via portion of a given metal layer, and lining the openings with a thin conductor (such as the bottom electrode 610), a thin insulator (such as the dielectric 616), and another thin conductor (such as the top electrode 612), the thin insulator insulating one thin conductor from the other thin conductor, thus forming a capacitor. In some embodiments, the MIM capacitor 175 may be fabricated in a separate process from the rest of the metal layer fabrication, e.g., to account for its large height and possibly different electrode material from the rest of the metal layer. This advantageously creates a relatively large capacitance in the MIM capacitor 175 by having a relatively large surface area for the terminals (e.g., the top and bottom electrodes 612 and 610) separated by a relatively small amount of insulation (e.g., the dielectric 616). The three layers of the capacitor 175 may be lined within the openings by, for example, atomic level deposition (ALD). For instance, the bottom electrode 610 can be lined to a thickness of about 20-40 nanometers using a conductive material (e.g., metal, conductive metal nitride or carbide, or the like), followed by a thin dielectric 616 (to increase capacitance, for example, about 3-40 nanometers), followed by a top electrode 616 again, using metal (such as about 20-40 nanometers thick), which can be coupled to the top electrode of at least some others, or every other, or all MIM capacitor 175, e.g., in an array of eDRAM memory cells, using the MIM capacitor plate 624. The MIM capacitor 175 can be e.g., about 300 nanometers tall (in the z-direction) in some embodiments, to provide sufficient capacitance.

For example, in one embodiment, the bottom electrode 610 may be tantalum (Ta). In another embodiment, the bottom electrode 610 may be titanium nitride (TiN). In some embodiments, the bottom electrode 610 may be titanium aluminum nitride (e.g., TiAlN, where the molar amount of titanium is at least that of aluminum). In another embodiment, the bottom electrode 610 may be tantalum aluminum carbide (TaAlC). In another embodiment, the bottom electrode 610 may be TaN. For example, in one embodiment, the top electrode 612 may be TiN. For example, in one embodiment, the dielectric 616 may be silicon oxide. In some embodiments, such as to reduce tunneling (e.g., when the dielectric 616 is very thin), the dielectric 616 may be a high-k material, e.g., any of the high-k materials described above.

Each bottom electrode 610 of the MIM capacitor 175 may connect to a corresponding storage node 240, as shown in FIG. 6A. The bottom electrodes 610 of the different MIM capacitors 175 may be electrically insulated from each other while the top electrodes 612 of at least some of the different MIM capacitors 175, e.g., all capacitors 175, may be electrically connected to each other through the (shared) top plate 624 at the top of the MIM capacitors 175 and also located in the via portion of the metal layer in which the respective MIM capacitor 175 is provided. In some embodiments, there may be separate top plates 624 for separate arrays of MIM capacitors 175. In some embodiments, the top plate 624 may be coupled to a common MIM capacitor plate, not specifically shown in FIG. 6A, which may be e.g., in the trench portion of the metal layer in which a given MIM capacitor 175 is implemented or in a higher or lower metal layer, to supply a common voltage to all of the top electrodes 612 in that metal layer through the top plate 624.

FIG. 6A further illustrates various, optional, interconnects 618 over the memory array, which interconnects may provide signals or supply lines. FIG. 6A also illustrates etch stop layer 256 between different metal layers, and example logic devices 258 provided in the FEOL 110, e.g., example FEOL transistors or other FEOL devices.

FIG. 6B provides a different cross-sectional view for that shown in FIG. 6A, namely, a x-z view, illustrating further details of the arrangement described above.

FIGS. 6A and 6B illustrate how different memory cells 250 may be arranged in different layers of the BEOL 120. As described above, in some embodiments, different portions of a single memory cell 250 may be provided in different metal layers of the BEOL 120. For example, FIGS. 6A and 6B illustrate that, for the bottom memory cells 250-11 and 250-12, the wordlines 220 may be located in a metal layer M5 (or, more generally, a metal layer Mx), the selector TFT 170, bitlines 230 and storage nodes 240 may be located in a metal layer M6 (or, more generally, a metal layer Mx+1), while the MIM capacitor 175 as well as the top plate 624 may be located a metal layer M7 (or, more generally, a metal layer Mx+2). Similarly, for the top memory cells 250-21 and 250-22, FIGS. 6A and 6B illustrate that the wordlines 220 may be located in a metal layer M7 (or, more generally, a metal layer My, where y is greater than x), the selector TFT 170, bitlines 230 and storage nodes 240 may be located in a metal layer M8 (or, more generally, a metal layer My+1), while the MIM capacitor 175 as well as the top plate 624 may be located a metal layer M9 (or, more generally, a metal layer My+2).

The memory cells 250-11 and 250-12 shown in FIGS. 6A-6B are examples of the memory cells of the bottom memory array 310, described above, while the memory cells 250-21 and 250-22 are examples of the memory cells of the top memory array 320, described above. Therefore, unless specified otherwise, descriptions provided above with respect to the bottom and top memory arrays and arrangement of the memory cells 250 provided above are applicable to FIGS. 6A-6B. In particular, FIGS. 6A-6B illustrate the shared wordline embodiment of FIG. 4, where memory cells in different layers above the substrate may be coupled to a shared wordline. This arrangement is best seen in the cross-sectional view of FIG. 6B illustrating that the wordline 220 of the memory cells 250-21 and 250-22 of the top memory array 320 (i.e., the wordline 220 in the M7 layer shown in FIG. 6B) is coupled to the wordline 220 of the memory cells 250-11 and 250-12 of the bottom memory array 310 (i.e., the wordline 220 in the M5 layer shown in FIG. 6B), where the coupling is achieved by means of interconnects in M7 and M6 layers, as shown in FIG. 6B. Thus, FIG. 6B illustrates an embodiment where a common wordline 220 in the M7 layer, coupled to gate terminals of a plurality of memory cells 250 in a given row i of one x-y plane memory array (namely, the memory cells 250-21 and 250-22 of the row i in the top memory array 320), is coupled to a common wordline 220 in the M5 layer, coupled to gate terminals of a plurality of memory cells 250 in the row i of another x-y plane memory array (namely, the memory cells 250-11 and 250-12 of the row i in the bottom memory array 310). In this manner, the common wordlines of a given row i may be shared between different x-y plane memory arrays and may be coupled to a single wordline driver.

Variations and Implementations

Various device assemblies illustrated in FIGS. 1-6 do not represent an exhaustive set of IC devices with stacked TFT based eDRAM memory arrays as described herein, but merely provide examples of such structures/assemblies. In particular, the number and positions of various elements shown in FIGS. 1-6 is purely illustrative and, in various other embodiments, other numbers of these elements, provided in other locations relative to one another may be used in accordance with the general architecture considerations described herein. For example, while FIG. 1 illustrates metal layers M1-M8 of the BEOL 120, in other embodiments, other number of metal layers may be included. In another example, while FIGS. 4-6 illustrate specific numbers of memory cells and specific number of stacked arrays (namely, one bottom memory array and one top memory array stacked over the bottom memory array), in other embodiments, any other number of memory cells may be included in an IC device implementing a three-dimensional stacked TFT based eDRAM memory array, with any number of two or more stacked x-y plane memory arrays.

Further, FIGS. 1-6 are intended to show relative arrangements of the elements therein, and the device assemblies of these FIGS. may include other elements that are not specifically illustrated (e.g., various interfacial layers). Similarly, although particular arrangements of materials are discussed with reference to FIGS. 1-6, intermediate materials may be included in the assemblies of these FIGS. Still further, although some elements of the various top down and cross-sectional views are illustrated in FIGS. 2, 3, and 6 as being planar rectangles or formed of rectangular solids, this is simply for ease of illustration, and embodiments of these assemblies may be curved, rounded, or otherwise irregularly shaped as dictated by, and sometimes inevitable due to, the manufacturing processes used to fabricate semiconductor device assemblies.

Inspection of layout and mask data and reverse engineering of parts of a device to reconstruct the circuit using e.g., optical microscopy, TEM, or SEM, and/or inspection of a cross-section of a device to detect the shape and the location of various device elements described herein using e.g., Physical Failure Analysis (PFA) would allow determination of the TFT-eDRAM memory arrays as described herein.

Example Fabrication Method

IC devices with stacked TFT based eDRAM memory arrays as described herein may be fabricated using any suitable techniques, e.g., subtractive, additive, damascene, dual damascene, etc. Some of such technique may include suitable deposition and patterning techniques. As used herein, "patterning" may refer to forming a pattern in one or more materials using any suitable techniques (e.g., applying a resist, patterning the resist using lithography, and then etching the one or more material using dry etching, wet etching, or any appropriate technique).

FIG. 7 illustrates an example method 700 of forming a stacked TFT based eDRAM memory array, according to some embodiments of the present disclosure. The method 700 may be used to fabricate the stacked TFT based eDRAM memory cells, arrays, and arrangements as shown in FIGS. 1-6. Although the particular manufacturing operations of the method 700 may be discussed below with reference to particular embodiments of the stacked TFT based eDRAM memory arrays as shown in FIGS. 1-6, at least some of these operations and/or operations with minor modifications may be applied to manufacturing many different embodiments of the stacked TFT based eDRAM memory arrays as discussed herein.

In addition, although the operations of the method 700 are illustrated in FIG. 7 once each and in a particular order, the operations may be performed in any suitable order and repeated as desired. For example, one or more operations may be performed in parallel to manufacture multiple TFT based eDRAM memory cells and/or to manufacture multiple stacked TFT based eDRAM memory arrays as described herein substantially simultaneously. In another example, the operations may be performed in a different order to reflect the architecture of a particular device component in which one or more TFT based eDRAM memory cells and/or one or more stacked TFT based eDRAM memory arrays as described herein are to be included. In yet another example, some operations may be combined into a single operation, and some operations may be subdivided into more operations than what is shown in FIG. 7.

Furthermore, the method 700 may also include operations not specifically shown in FIG. 7. In one example, such operations may include various cleaning operations as known in the art. For example, in some embodiments, device assemblies may be cleaned prior to and/or after any of the processes of the method 700 described herein, e.g. to remove surface-bound organic and metallic contaminants, as well as subsurface contamination, to promote adhesion, and/or to decrease interdiffusion of materials. In some embodiments, cleaning may be carried out using e.g. a chemical solutions (such as peroxide), and/or with ultraviolet (UV) radiation combined with ozone, and/or oxidizing the surface (e.g., using thermal oxidation) then removing the oxide (e.g. using hydrofluoric acid (HF)). In some embodiments, cleaning may be carried out using chemical or plasma clean, or applying heat in a controlled environment. In another example, in some embodiments, device assemblies may be planarized/polished before or after each of the processes shown in FIG. 7. Planarization may be performed using either wet or dry planarization processes. In one embodiment, planarization may be performed using chemical mechanical planarization (CMP), which may be understood as a process that utilizes a polishing surface, an abrasive and a slurry to remove the overburden of one or more materials which may cover upper surfaces of the assemblies, e.g., to expose surfaces of underlying materials for subsequent etch.

Turning to FIG. 7, the method 700 may begin a process 702 that involves forming logic devices (e.g., transistors, capacitors, resistors, and the like, such as e.g., the FEOL 110) in an FEOL process on a substrate. The substrate may, e.g., be the wafer 2000 of FIG. 8A, discussed below, and may be, or be included in, a die, e.g., the singulated die 2002 of FIG. 8B, discussed below. The substrate may be a semiconductor substrate composed of semiconductor material systems including, for example, N-type or P-type material systems. The substrate may include, for example, a crystalline substrate formed using a bulk silicon or a silicon-on-insulator (SOI) structure. In some embodiments, the substrate may be formed using alternative materials, which may or may not be combined with silicon, that include, but are not limited to, germanium, silicon germanium, indium antimonide, lead telluride, indium arsenide, indium phosphide, gallium arsenide, aluminum gallium arsenide, aluminum arsenide, indium aluminum arsenide, aluminum indium antimonide, indium gallium arsenide, gallium nitride, indium gallium nitride, aluminum indium nitride or gallium antimonide, or other combinations of group III-N or group IV materials. Further materials classified as group II-VI or group III-V may also be used to form the substrate on which logic devices are formed in the process 702. In some embodiments, the substrate may be non-crystalline. In some embodiments, the substrate may be a printed circuit board (PCB) substrate. Although a few examples of materials from which the substrate for housing the logic devices may be formed are described here, any material that may serve as a foundation for the IC device 100 with a stacked TFT based eDRAM memory array as described herein may be used.

Subsequently, the logic devices formed in the process 702 may be interconnected in a BEOL process, e.g., in the BEOL 120. Forming one or more stacked TFT based eDRAM memory arrays may be part of the BEOL process. Thus, after the process 702, the method 700 may proceed with forming a stacked TFT based eDRAM memory array, in a BEOL process, above at least portions of the logic devices. The BEOL process may include processes 704-714 as shown in FIG. 7, in which processes 704-708 refer to forming a first memory cell (or a plurality of such cells) in the lowest memory layer (i.e., in the lowest x-y plane memory array), e.g., any of the memory cells of the bottom memory array 310, while processes 710-714 refer to forming a second memory cell (or a plurality of such cells) in a memory layer stacked above the lowest memory layer, e.g., any of the memory cells of the top memory array 320.

A process 704 involves forming a first wordline in a metal layer X (e.g., a metal layer Mx) to supply a first gate signal to a first memory cell. The first wordline formed in the process 704 may include any embodiments of the wordline 220 of any of the memory cells of the lowest layer of a stacked TFT based eDRAM memory array described herein. Any suitable processes may be used to form the first wordline in the process 704, e.g., those including patterning, possibly in combination with a mask. The first wordline may include any suitable electrically conductive material, alloy, or a stack of multiple electrically conductive materials. In some embodiments, the first wordline formed in the process 704 may include one or more metals or metal alloys, with metals e.g., copper, ruthenium, palladium, platinum, cobalt, nickel, hafnium, zirconium, titanium, tantalum, and aluminum, tantalum nitride, titanium nitride, tungsten, doped silicon, doped germanium, or alloys and mixtures of these, which may be deposited using any suitable processes for providing electrically conductive materials, e.g., ALD, chemical vapor deposition (CVD), physical vapor deposition (PVD), or electroplating, in a damascene or a dual damascene process. In some embodiments, the process 704 may include providing a plurality of first wordlines for a plurality of memory cells of the lowest x-y memory array plane, e.g., for the memory cells of the bottom memory array 310.

A process 706 involves forming a first selector TFT, first bitline, and first storage node in a metal layer X+1 (e.g., a metal layer Mx+1), i.e., in a metal layer of the BEOL 120 that is above that in which the first wordline was formed in the process 704. The first selector TFT, first bitline, and first storage node formed in the process 706 may include any embodiments of the selector TFT 170, bitline 230, and storage node 240 of any of the memory cells of the lowest layer of a stacked TFT based eDRAM memory array described herein. Any suitable processes may be used to form the selector TFT, first bitline, and first storage node in the process 706, e.g., those including patterning, possibly in combination with a mask. Materials and processes described above for forming the first wordline in the process 704 are applicable to the bitline and storage node formed in the process 706 and, therefore, in the interests of brevity, are not repeated. Forming the first selector TFT in the process 706 may include, first, depositing a continuous layer of the channel material, and then patterning the channel material to form the channel layer 218 of the desired dimensions (e.g., any of the dimensions described above). The channel material for the first selector TFT may be deposited in the process 706 using any suitable thin film deposition technique, e.g., sputtering, evaporation, molecular beam epitaxy (MBE), ALD, PVD, pulsed laser deposition (PLD), or CVD. A layer of the channel material may be patterned in the process 706 using any suitable patterning techniques, e.g., photolithographic or electron-beam patterning, possibly in combination with using a mask, e.g., a hardmask, and including a suitable etching process to remove portions of the channel material, e.g., using dry etch, wet etch, reactive ion etch (RIE), ion milling, etc. In other embodiments, the process 706 may involve forming any one or more of the first selector TFT, first bitline, and first storage node in different metal layers above that of the first wordline.

A process 708 involves forming a first capacitor in a metal layer X+2 (e.g., a metal layer Mx+2), i.e., in a metal layer of the BEOL 120 that is above that in which the first selector TFT was formed in the process 706. The first capacitor formed in the process 708 may include any embodiments of the capacitor 175 of any of the memory cells of the lowest layer of a stacked TFT based eDRAM memory array described herein. Various processes, materials, and considerations for forming the MIM capacitor 175, described above, are applicable to forming the first capacitor in the process 708 and, therefore, in the interests of brevity, are not repeated here.

Processes 710, 712, and 714 involve processes similar to the processes 704, 706, and 708, respectively, but now for forming one or more memory cells in the next, stacked, layer above the FEOL 110, i.e., of the higher x-y plane memory array, e.g. the top memory array 320 as described herein. Keeping that difference in mind, descriptions provided for the processes 704, 706, and 708 are applicable to the processes 710, 712, and 714 and, therefore, in the interests of brevity, are not repeated here. The process 710 may start with forming a second wordline in a metal layer Y (e.g., a metal layer My), where Y could be equal to X+1, X+2, or may be provided with some intermediate other metal layers in between.

Example Electronic Devices

Arrangements with stacked TFT based eDRAM memory cells as disclosed herein may be included in any suitable electronic device. FIGS. 8-12 illustrate various examples of devices and components that may include one or more stacked TFT based eDRAM memory arrays as disclosed herein.

Figures 8A, 8B:
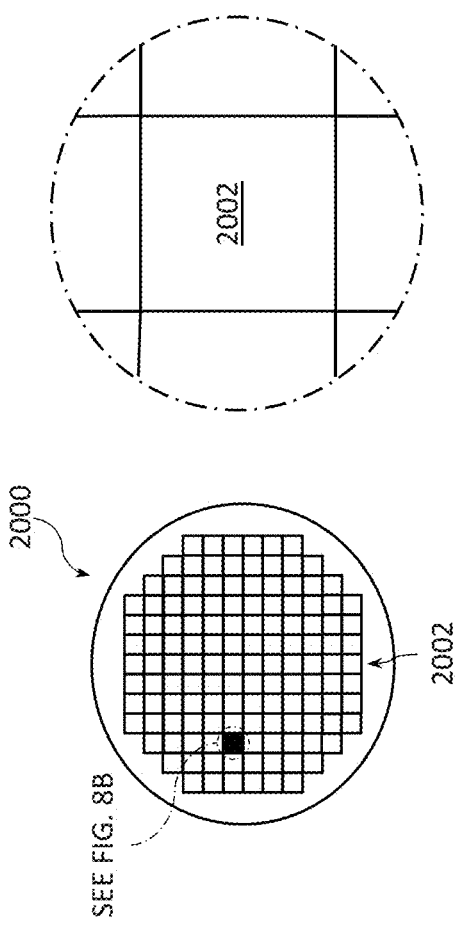
FIGS. 8A-8B are top views of a wafer and dies that include one or more stacked TFT based eDRAM memory arrays in accordance with any of the embodiments disclosed herein.

FIGS. 8A-8B are top views of a wafer 2000 and dies 2002 that may include one or more stacked TFT based eDRAM memory arrays in accordance with any of the embodiments disclosed herein. In some embodiments, the dies 2002 may be included in an IC package, in accordance with any of the embodiments disclosed herein. For example, any of the dies 2002 may serve as any of the dies 2256 in an IC package 2200 shown in FIG. 10. The wafer 2000 may be composed of semiconductor material and may include one or more dies 2002 having IC structures formed on a surface of the wafer 2000. Each of the dies 2002 may be a repeating unit of a semiconductor product that includes any suitable IC (e.g., ICs including one or more stacked TFT based eDRAM memory arrays as described herein). After the fabrication of the semiconductor product is complete (e.g., after manufacture of one or more stacked TFT based eDRAM memory arrays as described herein, e.g. any embodiment of the memory array 190 of the IC device 100), the wafer 2000 may undergo a singulation process in which each of the dies 2002 is separated from one another to provide discrete "chips" of the semiconductor product. In particular, devices that include one or more stacked TFT based eDRAM memory arrays as disclosed herein may take the form of the wafer 2000 (e.g., not singulated) or the form of the die 2002 (e.g., singulated). The die 2002 may include one or more transistors (e.g., one or more selector TFTs for the memory array 190 as described herein and/or one or more FEOL transistors 2140 of FIG. 9, discussed below) and/or supporting circuitry to route electrical signals to the transistors, as well as any other IC components. In some embodiments, the wafer 2000 or the die 2002 may implement or include a memory device (e.g., a SRAM device), a logic device (e.g., an AND, OR, NAND, or NOR gate), or any other suitable circuit element. Multiple ones of these devices may be combined on a single die 2002. For example, a memory array formed by multiple memory devices may be formed on a same die 2002 as a processing device (e.g., the processing device 2402 of FIG. 12) or other logic that is configured to store information in the memory devices or execute instructions stored in the memory array.

Figure 9:
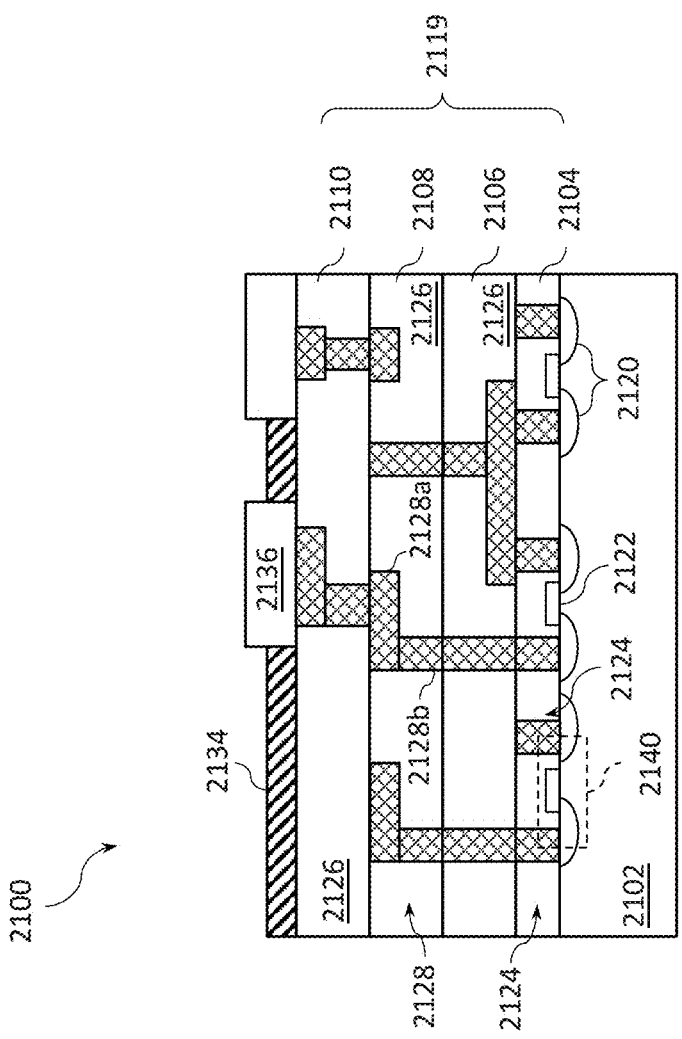
FIG. 9 is a cross-sectional side view of an IC device that may include one or more stacked TFT based eDRAM memory arrays in accordance with any of the embodiments disclosed herein.

FIG. 9 is a cross-sectional side view of an IC device 2100 that may include one or more stacked TFT based eDRAM memory arrays in accordance with any of the embodiments disclosed herein. For example, the IC device 2100 may be, or may include, the IC device 100, described above, implementing one or more memory arrays 190, one or more of which could be a stacked TFT based eDRAM memory array according to any embodiments described herein. In particular, the one or more stacked TFT based eDRAM memory arrays as described herein may be implemented in any of the BEOL layers of the IC device 2100, e.g., in any of the interconnect layers 2106-2110 shown in FIG. 9. Because there are various possibilities where such stacked TFT based eDRAM memory arrays may be integrated in the IC device 2100, the stacked TFT based eDRAM memory arrays are not specifically shown in FIG. 9. In some embodiments, the IC device 2100 may serve as any of the dies 2256 in the IC package 2300.

As shown in FIG. 9, the IC device 2100 may be formed on a substrate 2102 (e.g., the wafer 2000 of FIG. 8A) and may be included in a die (e.g., the die 2002 of FIG. 8B). The substrate 2102 may include any material that may serve as a foundation for an IC device 2100. The substrate 2102 may be a semiconductor substrate, and may be implemented as any of the examples provided above with reference to the process 702 shown in FIG. 7. Although a few examples of the substrate 2102 are described here, any material or structure that may serve as a foundation upon which an IC device 2100 may be built falls within the spirit and scope of the present disclosure. The substrate 2102 may be part of a singulated die (e.g., the die 2002 of FIG. 8B) or a wafer (e.g., the wafer 2000 of FIG. 8A).

The IC device 2100 may include one or more device layers 2104 disposed on the substrate 2102. The device layer 2104 may include features of one or more transistors 2140 (e.g., metal oxide semiconductor field-effect transistors (MOSFETs)) formed on the substrate 2102. The device layer 2104 may include, for example, one or more S/D regions 2120, a gate 2122 to control current flow in the transistors 2140 between the S/D regions 2120, and one or more S/D contacts 2124 to route electrical signals to/from the S/D regions 2120. The transistors 2140 may include additional features not depicted for the sake of clarity, such as device isolation regions, gate contacts, and the like.

Each transistor 2140 may include a gate 2122 formed of at least two layers, a gate dielectric layer and a gate electrode layer. Generally, the gate dielectric layer of a transistor 2140 may include one layer or a stack of layers, and may include any of the materials described above with reference to the gate dielectric 216. In some embodiments, an annealing process may be carried out on the gate dielectric of the gate 2122 to improve its quality when a high-k material is used.

The gate electrode may be formed on the gate dielectric and may include at least one P-type work function metal or N-type work function metal, depending on whether the transistor 2140 is to be a PMOS or an NMOS transistor. In some implementations, the gate electrode may include a stack of two or more metal layers, where one or more metal layers are work function metal layers and at least one metal layer is a fill metal layer. Further metal layers may be included for other purposes, such as a barrier layer. The gate electrode of the gate 2122 may include any of the materials described above with reference to the gate electrode 214.

In some embodiments, when viewed as a cross-section of the transistor 2140 along the source-channel-drain direction, the gate electrode of the gate 2122 may include a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may include a combination of U-shaped structures and planar, non-U-shaped structures. For example, the gate electrode may include one or more U-shaped metal layers formed atop one or more planar, non-U-shaped layers. In some embodiments, the gate electrode may include a V-shaped structure (e.g., when the fin of a FinFET does not have a "flat" upper surface, but instead has a rounded peak).

In some embodiments, a pair of sidewall spacers may be formed on opposing sides of the gate stack to bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 2120 may be formed within the substrate 2102, e.g., adjacent to the gate of each transistor 2140. The S/D regions 2120 may be formed using an implantation/diffusion process or an etching/deposition process, for example. In the former process, dopants such as boron, aluminum, antimony, phosphorous, or arsenic may be ion-implanted into the substrate 2102 to form the S/D regions 2120. An annealing process that activates the dopants and causes them to diffuse farther into the substrate 2102 may follow the ion-implantation process. In the latter process, the substrate 2102 may first be etched to form recesses at the locations of the S/D regions 2120. An epitaxial deposition process may then be carried out to fill the recesses with material that is used to fabricate the S/D regions 2120. In some implementations, the S/D regions 2120 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 2120 may be formed using one or more alternate semiconductor materials such as germanium or a group III-V material or alloy. In further embodiments, one or more layers of metal and/or metal alloys may be used to form the S/D regions 2120.

Various transistors 2140 are not limited to the type and configuration depicted in FIG. 9 and may include a wide variety of other types and configurations such as, for example, planar transistors, non-planar transistors (e.g., FinFETs, nanowire, or nanoribbon transistors), or a combination of both.

Electrical signals, such as power and/or input/output (I/O) signals, may be routed to and/or from the transistors 2140 of the device layer 2104 through one or more interconnect layers disposed on the device layer 2104 (illustrated in FIG. 9 as interconnect layers 2106-2110). For example, electrically conductive features of the device layer 2104 (e.g., the gate 2122 and the S/D contacts 2124) may be electrically coupled with the interconnect structures 2128 of the interconnect layers 2106-2110. The one or more interconnect layers 2106-2110 may form an ILD stack 2119 of the IC device 2100.

The interconnect structures 2128 may be arranged within the interconnect layers 2106-1210 to route electrical signals according to a wide variety of designs (in particular, the arrangement is not limited to the particular configuration of interconnect structures 2128 depicted in FIG. 9). Although a particular number of interconnect layers 2106-1210 is depicted in FIG. 9, embodiments of the present disclosure include IC devices having more or fewer interconnect layers than depicted.

In some embodiments, the interconnect structures 2128 may include trench structures 2128a (sometimes referred to as "lines") and/or via structures 2128b (sometimes referred to as "holes") filled with an electrically conductive material such as a metal. The trench structures 2128a may be arranged to route electrical signals in a direction of a plane that is substantially parallel with a surface of the substrate 2102 upon which the device layer 2104 is formed. For example, the trench structures 2128a may route electrical signals in a direction in and out of the page from the perspective of FIG. 9. The via structures 2128b may be arranged to route electrical signals in a direction of a plane that is substantially perpendicular to the surface of the substrate 2102 upon which the device layer 2104 is formed. In some embodiments, the via structures 2128b may electrically couple trench structures 2128a of different interconnect layers 2106-2110 together.

The interconnect layers 2106-2110 may include a dielectric material 2126 disposed between the interconnect structures 2128, as shown in FIG. 9. In some embodiments, the dielectric material 2126 disposed between the interconnect structures 2128 in different ones of the interconnect layers 2106-2110 may have different compositions; in other embodiments, the composition of the dielectric material 2126 between different interconnect layers 2106-2110 may be the same. The dielectric material 2126 may include any of the materials described above with reference to the dielectric material 252.

A first interconnect layer 2106 (referred to as Metal 1 or "M1") may be formed directly on the device layer 2104. In some embodiments, the first interconnect layer 2106 may include trench structures 2128a and/or via structures 2128b, as shown. The trench structures 2128a of the first interconnect layer 2106 may be coupled with contacts (e.g., the S/D contacts 2124) of the device layer 2104.

A second interconnect layer 2108 (referred to as Metal 2 or "M2") may be formed directly on the first interconnect layer 2106. In some embodiments, the second interconnect layer 2108 may include via structures 2128b to couple the trench structures 2128a of the second interconnect layer 2108 with the trench structures 2128a of the first interconnect layer 2106. Although the trench structures 2128a and the via structures 2128b are structurally delineated with a line within each interconnect layer (e.g., within the second interconnect layer 2108) for the sake of clarity, the trench structures 2128a and the via structures 2128b may be structurally and/or materially contiguous (e.g., simultaneously filled during a dual damascene process) in some embodiments.

A third interconnect layer 2110 (referred to as Metal 3 or "M3") (and additional interconnect layers, as desired) may be formed in succession on the second interconnect layer 2108 according to similar techniques and configurations described in connection with the second interconnect layer 2108 or the first interconnect layer 2106.

The interconnect layers 2106-2110 may be the metal layers M1-M3, described above and shown in FIG. 1. Further metal layers may be present in the IC device 2100, as also described above.

The IC device 2100 may include a solder resist material 2134 (e.g., polyimide or similar material) and one or more bond pads 2136 formed on the interconnect layers 2106-2110. The bond pads 2136 may be electrically coupled with the interconnect structures 2128 and configured to route the electrical signals of the transistor(s) 2140 to other external devices. For example, solder bonds may be formed on the one or more bond pads 2136 to mechanically and/or electrically couple a chip including the IC device 2100 with another component (e.g., a circuit board). The IC device 2100 may have other alternative configurations to route the electrical signals from the interconnect layers 2106-2110 than depicted in other embodiments. For example, the bond pads 2136 may be replaced by or may further include other analogous features (e.g., posts) that route the electrical signals to external components.

Figure 10:
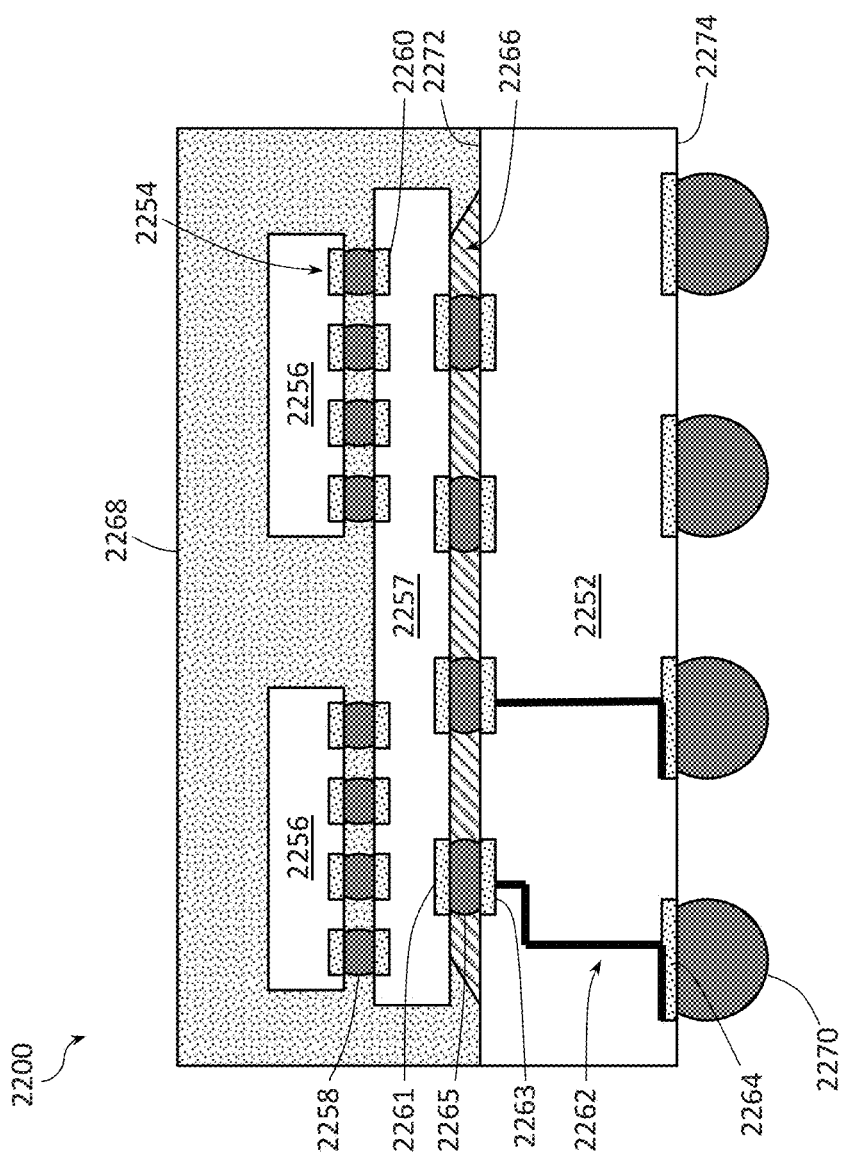
FIG. 10 is a cross-sectional side view of an IC package that may include one or more stacked TFT based eDRAM memory arrays in accordance with any of the embodiments disclosed herein.

FIG. 10 is a side, cross-sectional view of an example IC package 2200 that may include one or more stacked TFT based eDRAM memory arrays in accordance with any of the embodiments disclosed herein. In some embodiments, the IC package 2200 may be a system-in-package (SiP).

The package substrate 2252 may be formed of a dielectric material (e.g., a ceramic, a buildup film, an epoxy film having filler particles therein, etc.), and may have conductive pathways extending through the dielectric material between the face 2272 and the face 2274, or between different locations on the face 2272, and/or between different locations on the face 2274. These conductive pathways may take the form of any of the interconnect structures 2128 discussed above with reference to FIG. 9.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 10 are solder bumps, but any suitable first-level interconnects 2265 may be used. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 10 are solder bumps, but any suitable first-level interconnects 2258 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 10 are solder balls (e.g., for a ball grid array arrangement), but any suitable second-level interconnects 22770 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 11.

The dies 2256 may take the form of any of the embodiments of the die 2002 discussed herein (e.g., may include any of the embodiments of the IC device 2100). In embodiments in which the IC package 2200 includes multiple dies 2256, the IC package 2200 may be referred to as a multi-chip package (MCP). The dies 2256 may include circuitry to perform any desired functionality. For example, one or more of the dies 2256 may be logic dies (e.g., silicon-based dies), and one or more of the dies 2256 may be memory dies (e.g., high bandwidth memory), including embedded memory dies as described herein. In some embodiments, any of the dies 2256 may include one or more stacked TFT based eDRAM memory arrays, e.g., as discussed above; in some embodiments, at least some of the dies 2256 may not include any stacked TFT based eDRAM memory arrays.

The IC package 2200 illustrated in FIG. 10 may be a flip chip package, although other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 10, an IC package 2200 may include any desired number of the dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

Figure 11:
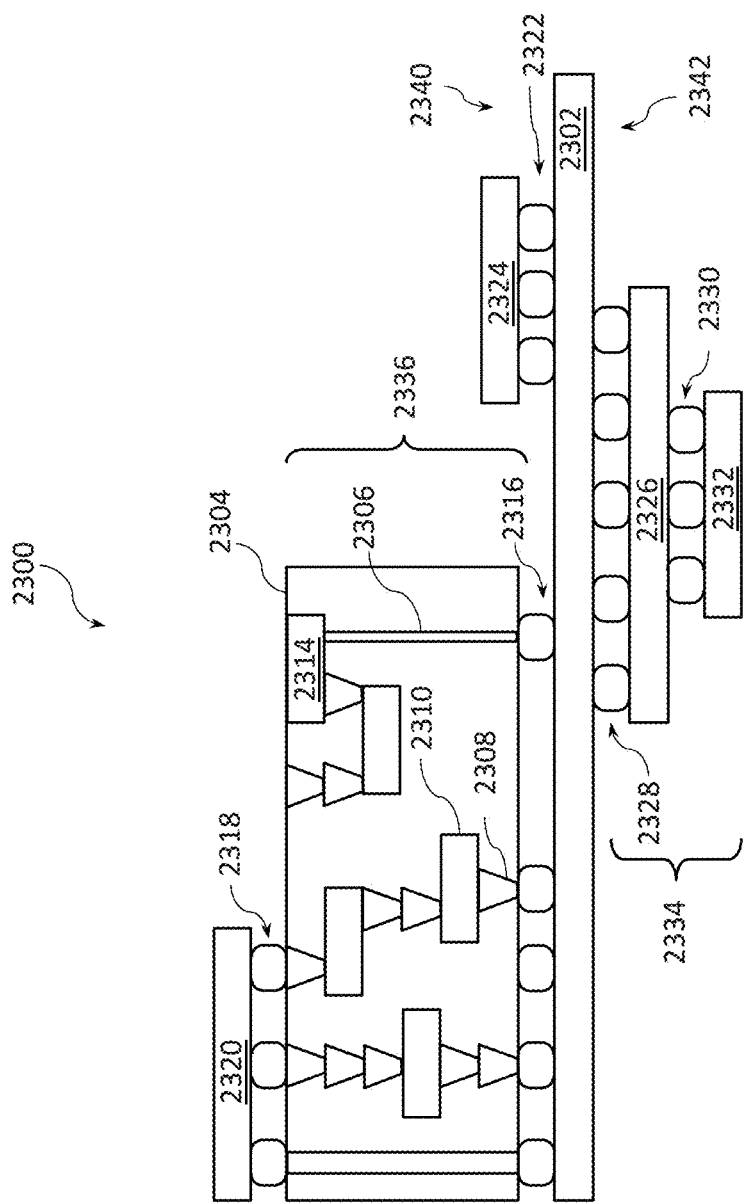
FIG. 11 is a cross-sectional side view of an IC device assembly that may include one or more stacked TFT based eDRAM memory arrays in accordance with any of the embodiments disclosed herein.

FIG. 11 is a cross-sectional side view of an IC device assembly 2300 that may include components having one or more stacked TFT based eDRAM memory arrays in accordance with any of the embodiments disclosed herein. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of one or more stacked TFT based eDRAM memory arrays in accordance with any of the embodiments disclosed herein; e.g., any of the IC packages discussed below with reference to the IC device assembly 2300 may take the form of any of the embodiments of the IC package 2200 discussed above with reference to FIG. 10 (e.g., may include one or more stacked TFT based eDRAM memory arrays provided on a die 2256).

In some embodiments, the circuit board 2302 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

The IC device assembly 2300 illustrated in FIG. 11 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (e.g., as shown in FIG. 11), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 may be or include, for example, a die (the die 2002 of FIG. 8B), an IC device (e.g., the IC device 2100 of FIG. 9), or any other suitable component. In particular, the IC package 2320 may include one or more stacked TFT based eDRAM memory arrays as described herein. Although a single IC package 2320 is shown in FIG. 11, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 11, the IC package 2320 and the circuit board 2302 are attached to opposing sides of the interposer 2304; in other embodiments, the IC package 2320 and the circuit board 2302 may be attached to a same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other group III-V and group IV materials. The interposer 2304 may include metal interconnects 2308 and vias 2310, including but not limited to through-silicon vias (TSVs) 2306. The interposer 2304 may further include embedded devices 2314, including both passive and active devices. Such devices may include, but are not limited to, capacitors, decoupling capacitors, resistors, inductors, fuses, diodes, transformers, sensors, electrostatic discharge (ESD) protection devices, and memory devices. More complex devices such as radio frequency (RF) devices, power amplifiers, power management devices, antennas, arrays, sensors, and microelectromechanical systems (MEMS) devices may also be formed on the interposer 2304. The package-on-interposer structure 2336 may take the form of any of the package-on-interposer structures known in the art.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 11 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

Figure 12:
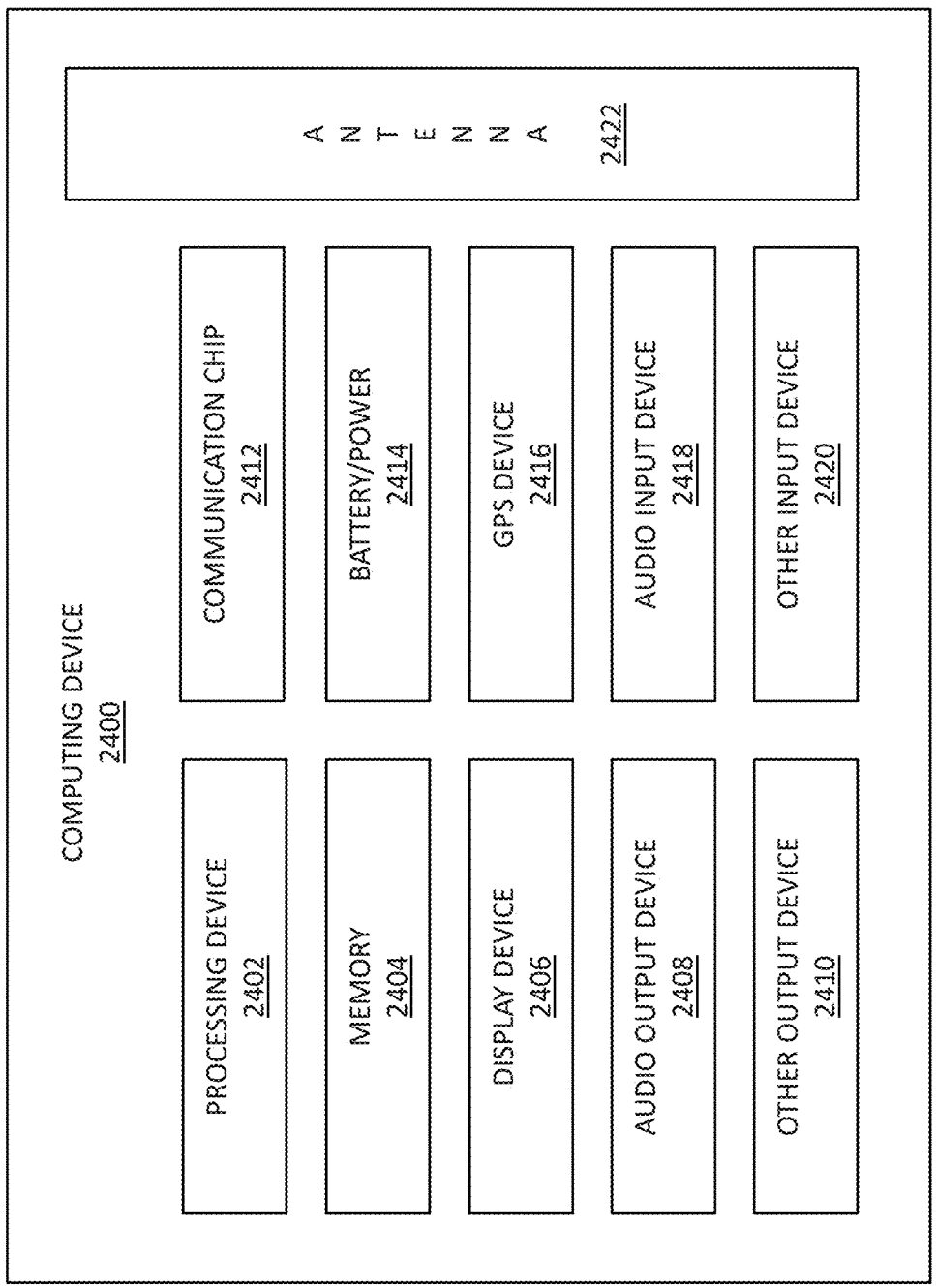
FIG. 12 is a block diagram of an example computing device that may include one or more stacked TFT based eDRAM memory arrays in accordance with any of the embodiments disclosed herein.

FIG. 12 is a block diagram of an example computing device 2400 that may include one or more components with one or more stacked TFT based eDRAM memory arrays in accordance with any of the embodiments disclosed herein. For example, any suitable ones of the components of the computing device 2400 may include a die (e.g., the die 2002 (FIG. 8B)) including one or more stacked TFT based eDRAM memory arrays in accordance with any of the embodiments disclosed herein. Any of the components of the computing device 2400 may include an IC device 2100 (FIG. 9) and/or an IC package 2200 (FIG. 10). Any of the components of the computing device 2400 may include an IC device assembly 2300 (FIG. 11).

A number of components are illustrated in FIG. 12 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single SoC die.

Additionally, in various embodiments, the computing device 2400 may not include one or more of the components illustrated in FIG. 12, but the computing device 2400 may include interface circuitry for coupling to the one or more components. For example, the computing device 2400 may not include a display device 2406, but may include display device interface circuitry (e.g., a connector and driver circuitry) to which a display device 2406 may be coupled. In another set of examples, the computing device 2400 may not include an audio input device 2418 or an audio output device 2408, but may include audio input or output device interface circuitry (e.g., connectors and supporting circuitry) to which an audio input device 2418 or audio output device 2408 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 2400 may include a memory 2404, which may itself include one or more memory devices such as volatile memory (e.g., DRAM), nonvolatile memory (e.g., read-only memory (ROM)), flash memory, solid state memory, and/or a hard drive. In some embodiments, the memory 2404 may include memory that shares a die with the processing device 2402. This memory may be used as cache memory and may include eDRAM, e.g. a stacked TFT based eDRAM as described herein, and/or spin transfer torque magnetic random-access memory (STT-M RAM).

In some embodiments, the computing device 2400 may include a communication chip 2412 (e.g., one or more communication chips). For example, the communication chip 2412 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2412 may operate in accordance with other wireless protocols in other embodiments. The computing device 2400 may include an antenna 2422 to facilitate wireless communications and/or to receive other wireless communications (such as AM or FM radio transmissions).

In some embodiments, the communication chip 2412 may manage wired communications, such as electrical, optical, or any other suitable communication protocols (e.g., the Ethernet). As noted above, the communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

The computing device 2400 may include battery/power circuitry 2414. The battery/power circuitry 2414 may include one or more energy storage devices (e.g., batteries or capacitors) and/or circuitry for coupling components of the computing device 2400 to an energy source separate from the computing device 2400 (e.g., AC line power).

The computing device 2400 may include a display device 2406 (or corresponding interface circuitry, as discussed above). The display device 2406 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2408 (or corresponding interface circuitry, as discussed above). The audio output device 2408 may include any device that generates an audible indicator, such as speakers, headsets, or earbuds, for example.

The computing device 2400 may include an audio input device 2418 (or corresponding interface circuitry, as discussed above). The audio input device 2418 may include any device that generates a signal representative of a sound, such as microphones, microphone arrays, or digital instruments (e.g., instruments having a musical instrument digital interface (MIDI) output).

The computing device 2400 may include a GPS device 2416 (or corresponding interface circuitry, as discussed above). The GPS device 2416 may be in communication with a satellite-based system and may receive a location of the computing device 2400, as known in the art.

The computing device 2400 may include an other output device 2410 (or corresponding interface circuitry, as discussed above). Examples of the other output device 2410 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

SELECT EXAMPLES

The following paragraphs provide various examples of the embodiments disclosed herein.

Example 1 provides an IC device that includes a stacked TFT based eDRAM memory array. The array includes a first memory cell (a first eDRAM cell) provided in a first layer over a substrate, and a second memory cell (a second eDRAM cell) provided in a second layer over the substrate, where the first layer is between the substrate and the second layer (i.e., the second layer is above the first layer, and, therefore, the first and second memory cells may be referred to as "stacked" memory cells), where each of the first memory cell and the second memory cell includes a TFT as a selector transistor of the memory cell, the selector transistor configured to control transfer of a memory state of the memory cell between a first region and a second region of a channel layer in response to a gate signal supplied to a wordline.

Example 2 provides the IC device according to example 1, where the TFT includes a channel layer (which may also be referred to as an "active layer"), a gate electrode, a first source/drain (S/D) electrode, and a second S/D electrode, where the channel layer is between the gate electrode and the first and second S/D electrodes. In some embodiments, the gate electrode may be between the substrate and the channel layer (i.e., the TFT of each of the first and second stacked memory cells may be a bottom-gated TFT). In other embodiments, the TFT of each of the first and second stacked memory cells may be a top-gated TFT. In still other embodiments, one TFT of the first and second stacked memory cells may be a bottom-gated TFT and the other TFT may be a top-gated TFT.

Example 3 provides the IC device according to example 2, where the channel layer of the TFT includes one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, and black phosphorus.

Example 4 provides the IC device according to examples 2 or 3, further including, for each of the first memory cell and the second memory cell, a wordline coupled to the gate electrode and configured to supply a gate signal to the respective memory cell to which the wordline is coupled to, a MIM capacitor coupled to the first S/D electrode (in some embodiments, a storage node may be coupled to and above the first region of the channel layer of the respective TFT, and the MIM capacitor may be coupled to and above the storage node and configured to store the memory state of the respective memory cell), and a bitline coupled to the second S/D electrode (the bitline is configured to transfer the memory state and is coupled to and above the second region of the channel layer of the respective TFT).

Example 5 provides the IC device according to example 4, where, for each of the first memory cell and the second memory cell, the wordline is between the substrate and the gate electrode.

Example 6 provides the IC device according to example 4, where, for each of the first memory cell and the second memory cell, the bitline is further away from the substrate than the channel layer.

Example 7 provides the IC device according to example 4, where, for each of the first memory cell and the second memory cell, a thickness of the bitline is between 5 and 80 nanometers.

Example 8 provides the IC device according to example 4, where each of the first memory cell and the second memory cell further includes a storage node, where the capacitor is coupled to the first S/D electrode by having a bottom electrode of the capacitor being coupled to the storage node and the storage node being coupled to the first S/D electrode, and the capacitor further includes a top electrode coupled to a capacitor plate, and an insulator between the bottom electrode and the top electrode.

Example 9 provides the IC device according to any one of example 4-8, where the wordline coupled to the gate electrode of the TFT of the first memory cell is coupled to the wordline coupled to the gate electrode of the TFT of the second memory cell (in other words, the wordlines of these two stacked memory cells are electrically coupled to one another, which allows them to be connected to a single wordline driver).

Example 10 provides the IC device according to any one of example 4-8, where the wordline coupled to the gate electrode of the TFT of the first memory cell and the wordline coupled to the gate electrode of the TFT of the second memory cell are coupled to a single wordline driver.

Example 11 provides the IC device according to any one of example 4-10, where the bitline coupled to the second S/D electrode of the TFT of the first memory cell and the bitline coupled to the second S/D electrode of the TFT of the second memory cell are coupled to a multiplexer, where the multiplexer is coupled to a sense amplifier, and the multiplexer is configured to select one of these two bitlines for reading a corresponding memory cell. Such an arrangement advantageously allows using a single sense amplifier (coupled to the multiplexer) to read memory cells in different layers above the substrate.

Example 12 provides the IC device according to any one of example 4-8, where the bitline coupled to the second S/D electrode of the TFT of the first memory cell is coupled to the bitline coupled to the second S/D electrode of the TFT of the second memory cell (in other words, the bitlines of these two stacked memory cells are electrically coupled to one another, which allows them to be connected to a single sense amplifier).

Example 13 provides the IC device according to any one of example 4-8, where the bitline coupled to the second S/D electrode of the TFT of the first memory cell and the bitline coupled to the second S/D electrode of the TFT of the second memory cell are coupled to a single sense amplifier.

Example 14 provides the IC device according to any one of example 4-8, 12, and 13, where the wordline coupled to the gate electrode of the TFT of the first memory cell is coupled to a first wordline driver and the wordline coupled to the gate electrode of the TFT of the second memory cell is coupled to a second wordline driver. By coupling wordlines of different memory cells to different wordline drivers for those memory cells whose bitlines are coupled to a single sense amplifier, it is possible to use a single sense amplifier to read different memory cells by activating the memory cells using their respective wordline drivers.

Example 15 provides the IC device according to any one of example 4-14, where a portion of the wordline coupled to the gate electrode of the TFT of the first memory cell is between a portion of the wordline coupled to the gate electrode of the TFT of the second memory cell and the substrate (in other words, a portion of the wordline of the second memory cell is further away from the substrate than a portion of the wordline of the first memory cell).

Example 16 provides the IC device according to any one of the preceding examples, where a projection of the TFT of the first memory cell on to a plane parallel to the substrate is offset with respect to a projection of the TFT of the second memory cell on to said plane. In general, when the first memory cell is one of a plurality of first memory cells in the first layer and the second memory cell is one of a plurality of second memory cells in the second layer, the first and second memory cells may be interleaved, which may advantageously enable reduced area for bitline landing for these cells from the same edge of the array.

Example 17 provides an IC device that includes a plurality of first memory cells, each of the plurality of first memory cells including a first TFT as a selector transistor of each first memory cell, the first TFT provided in a first layer above a substrate; and a plurality of second memory cells, each of the plurality of second memory cells including a second TFT as a selector transistor of each second memory cell, the second TFT provided in a second layer above the substrate. The first layer is between the substrate and the second layer (i.e., the second layer is above the first layer, and, therefore, the first and second memory cells may be referred to as "stacked" memory cells). Each of the first TFT and the second TFT includes a channel layer and is configured to control transfer of a memory state of the memory cell between a first region and a second region of the channel layer in response to a gate signal supplied by a wordline connected to the respective memory cell (e.g., connected to the gate electrode of the respective first or second TFT).

Example 18 provides the IC device according to example 17, further including a wordline coupled to a gate electrode of the first TFT of each of the plurality of first memory cells and to a gate electrode of the second TFT of each of the plurality of second memory cells, the wordline coupled to a wordline driver and configured to supply a gate signal to the respective memory cell to which the wordline is coupled to.

Example 19 provides the IC device according to example 18, further including a first bitline coupled to a source/drain (S/D) electrode of the first TFT of a first memory cell of the plurality of first memory cells; and a second bitline coupled to a S/D electrode of the second TFT of a first memory cell of the plurality of second memory cells, where the first bitline and the second bitline are coupled to a first multiplexer, each bitline configured to transfer the memory state of the respective TFT and coupled to and above the second region of the channel layer of the respective TFT.

Example 20 provides the IC device according to example 19, further including a third bitline coupled to a S/D electrode of the first TFT of a second memory cell of the plurality of first memory cells (the second memory cell of the plurality of first memory cells being different from the first memory cell of the plurality of first memory cells); and a fourth bitline coupled to a S/D electrode of the second TFT of a second memory cell of the plurality of second memory cells (the second memory cell of the plurality of second memory cells being different from the first memory cell of the plurality of second memory cells), where the third bitline and the fourth bitline are coupled to a second multiplexer (the second multiplexer being different from the first multiplexer).

Example 21 provides the IC device according to example 17, further including a first bitline coupled to a source/drain (S/D) electrode of the first TFT of a first memory cell of the plurality of first memory cells and to a S/D electrode of the second TFT of a first memory cell of the plurality of second memory cells, the bitline configured to transfer the memory state of the respective TFT and coupled to and above the second region of the channel layer of the respective TFT, where the first bitline is coupled to a first sense amplifier.

Example 22 provides the IC device according to example 21, further including a second bitline coupled to a S/D electrode of the first TFT of a second memory cell of the plurality of first memory cells (the second memory cell of the plurality of first memory cells being different from the first memory cell of the plurality of first memory cells) and to a S/D electrode of the second TFT of a second memory cell of the plurality of second memory cells (the second memory cell of the plurality of second memory cells being different from the first memory cell of the plurality of second memory cells), where the second bitline is coupled to a second sense amplifier, different from the first sense amplifier.

Example 23 provides the IC device according to example 22, further including a first wordline coupled to a gate electrode of the first TFT of the first memory cell of the plurality of first memory cells and to a gate electrode of the first TFT of the second memory cell of the plurality of first memory cells; and a second wordline coupled to a gate electrode of the second TFT of the first memory cell of the plurality of second memory cells and to a gate electrode of the second TFT of the second memory cell of the plurality of second memory cells, where the first wordline and the second wordline are coupled to individual (i.e., separate) wordline drivers.

Example 24 provides the IC device according to any one of examples 17-23, where each of the plurality of first memory cells is the first memory cell of the IC device according to any one of examples 1-16, and each of the plurality of second memory cells is the second memory cell of the IC device according to any one of examples 1-16.

Example 25 provides a method of forming an IC device, the method including forming logic devices in a FEOL process on a substrate, and forming memory cells (eDRAM cells) in a BEOL process. The BEOL process includes forming a first memory cell including a first selector TFT, and forming a second memory cell including a second selector TFT, where the second selector TFT is further away from the substrate than the first selector TFT (i.e., the second selector TFT is stacked in a layer above the layer of the first selector TFT, and, therefore, the first and second memory cells may be referred to as "stacked" memory cells).

Example 26 provides the method according to example 25, where forming the first memory cell includes forming a first wordline in a first layer over the substrate to supply a first gate signal, forming the first selector TFT above the first wordline using a first thin film process, the first selector TFT having a channel layer and configured to control transfer of a memory state of the first memory cell between a first region and a second region of the channel layer of the first selector TFT in response to the first gate signal, forming a first bitline above the first selector TFT to transfer the memory state of the first memory cell, the first bitline being coupled to and above the second region of the channel layer of the first selector TFT, forming a first storage node coupled to and above the first region of the channel layer of the first selector TFT, and forming a first MIM capacitor coupled to and above the first storage node and configured to store the memory state of the first memory cell.

Example 27 provides the method according to example 25, where forming the second memory cell includes forming a second wordline to supply a second gate signal, forming the second selector TFT above the second wordline using a second thin film process, the second selector TFT having a channel layer and configured to control transfer of a memory state of the second memory cell between a first region and a second region of the channel layer of the second selector TFT in response to the second gate signal, forming a second bitline above the second selector TFT to transfer the memory state of the second memory cell, the second bitline being coupled to and above the second region of the channel layer of the second selector TFT, forming a second storage node coupled to and above the first region of the channel layer of the second selector TFT, and forming a second MIM capacitor coupled to and above the second storage node and configured to store the memory state of the second memory cell.

Example 28 provides the method according to any one of examples 25-27, where the BEOL process further includes interconnecting the logic devices.

Example 29 provides the method according to any one of examples 25-28, where the first memory cell is the first memory cell of the IC device according to any one of examples 1-16, and the second memory cell is the second memory cell of the IC device according to any one of examples 1-16.

Example 30 provides the method according to any one of examples 25-29, where the first memory cell is one of the plurality of first memory cell of the IC device according to any one of examples 17-24, and the second memory cell is one of the plurality of second memory cells of the IC device according to any one of examples 17-24.

Example 31 provides an IC package that includes an IC die, including one or more of IC devices according to any one of the preceding examples (e.g., each IC device may be an IC device according to any one of examples 1-16 and/or may be formed according to a method of any one of examples 25-30) and/or one or more of IC devices according to any one of the preceding examples (e.g., each IC device may be an IC device according to any one of examples 17-24 and/or may be formed according to a method of any one of examples 25-30); and a further component, coupled to the IC die.

Example 32 provides the IC package according to example 31, where the further component is one of a package substrate, a flexible substrate, or an interposer.

Example 33 provides the IC package according to examples 31 or 32, where the further component is coupled to the IC die via one or more first-level interconnects.

Example 34 provides the IC package according to example 33, where the one or more first-level interconnects include one or more solder bumps, solder posts, or bond wires.

Example 35 provides a computing device that includes a circuit board; and an IC die coupled to the circuit board, where the IC die includes one or more of: one or more IC devices according to any one of the preceding examples (e.g., each IC device may be an IC device according to any one of examples 1-16 and/or may be formed according to a method of any one of examples 25-30), one or more of IC devices according to any one of the preceding examples (e.g., each IC device may be an IC device according to any one of examples 17-24 and/or may be formed according to a method of any one of examples 25-30), and the IC package according to any one of the preceding examples (e.g., the IC package according to any one of examples 31-34).

Example 36 provides the computing device according to example 35, where the computing device is a wearable computing device (e.g., a smart watch) or handheld computing device (e.g., a mobile phone).

Example 37 provides the computing device according to examples 35 or 36, where the computing device is a server processor.

Example 38 provides the computing device according to examples 35 or 36, where the computing device is a motherboard.

Example 39 provides the computing device according to any one of examples 35-38, where the computing device further includes one or more communication chips and an antenna.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. An integrated circuit (IC) device, comprising:
a first memory cell in a first layer over a substrate; and
a second memory cell in a second layer over the substrate, wherein the first layer is between the substrate and the second layer,
wherein:
each of the first memory cell and the second memory cell includes a thin-film transistor (TFT) that includes a channel layer, a gate electrode, a source electrode, and a drain electrode, where one of the source electrode and the drain electrode is a first electrode and another one is a second electrode, and where the channel layer is between the gate electrode and the first and second electrodes,
for at least one of the first memory cell and the second memory cell, a wordline is coupled to the gate electrode, the wordline being between the substrate and the gate electrode, and
the IC device further includes, for each of the first memory cell and the second memory cell, a capacitor coupled to the first electrode and a bitline coupled to the second electrode.

2. The IC device according to claim 1, wherein, for at least one of the first memory cell and the second memory cell, a distance between the substrate and the channel layer is smaller than a distance between the substrate and the bitline.

3. The IC device according to claim 1, wherein each of the first memory cell and the second memory cell further includes a storage node, wherein:
the capacitor is coupled to the first electrode by having a bottom electrode of the capacitor being coupled to the storage node and the storage node being coupled to the first electrode, and
the capacitor further includes a top electrode coupled to a capacitor plate, and an insulator between the bottom electrode and the top electrode.

4. The IC device according to claim 1, wherein the wordline coupled to the gate electrode of the TFT of the first memory cell is coupled to the wordline coupled to the gate electrode of the TFT of the second memory cell.

5. The IC device according to claim 4, wherein the bitline coupled to the second electrode of the TFT of the first memory cell and the bitline coupled to the second electrode of the TFT of the second memory cell are coupled to a multiplexer.

6. The IC device according to claim 5, wherein the wordline coupled to the gate electrode of the TFT of the first memory cell is coupled to a first wordline driver and the wordline coupled to the gate electrode of the TFT of the second memory cell is coupled to a second wordline driver.

7. The IC device according to claim 1, wherein the wordline coupled to the gate electrode of the TFT of the first memory cell and the wordline coupled to the gate electrode of the TFT of the second memory cell are coupled to a single wordline driver.

8. The IC device according to claim 1, wherein the bitline coupled to the second electrode of the TFT of the first memory cell is coupled to the bitline coupled to the second electrode of the TFT of the second memory cell.

9. The IC device according to claim 1, wherein the bitline coupled to the second electrode of the TFT of the first memory cell and the bitline coupled to the second electrode of the TFT of the second memory cell are coupled to a single sense amplifier.

10. The IC device according to claim 1, wherein a portion of the wordline coupled to the gate electrode of the TFT of the first memory cell is between a portion of the wordline coupled to the gate electrode of the TFT of the second memory cell and the substrate.

11. The IC device according to claim 1, wherein the wordline is coupled to the gate electrode for each of the first memory cell and the second memory cell, and, for each of the first memory cell and the second memory cell, the wordline being between the substrate and the gate electrode.

12. The IC device according to claim 1, wherein the IC device is one of a memory device, a wearable computing device, a handheld computing device, a server processor, or a motherboard.

13. The IC device according to claim 1, further comprising:
an IC die; and
a further component, coupled to the IC die,
wherein the IC die includes the first memory cell, the second memory cell, the capacitor, and the bitline.

14. The IC device according to claim 13, wherein the further component is one of a package substrate, a flexible substrate, or an interposer.

15. An integrated circuit (IC) device, comprising:
a plurality of first memory cells, each of the plurality of first memory cells comprising a first thin film transistor (TFT) in a first layer above a substrate; and
a plurality of second memory cells, each of the plurality of second memory cells comprising a second TFT in a second layer above the substrate, wherein the first layer is between the substrate and the second layer;

a wordline coupled to a gate electrode of the first TFT of each of the plurality of first memory cells and to a gate electrode of the second TFT of each of the plurality of second memory cells, wherein the wordline is between the substrate and the gate electrode of the first TFT or the wordline is between the substrate and the gate electrode of the second TFT;

a first bitline coupled to an electrode of the first TFT of a first memory cell of the plurality of first memory cells; and a second bitline coupled to an electrode of the second TFT of a first memory cell of the plurality of second memory cells, wherein:
 the electrode of the first TFT is either a source electrode or a drain electrode of the first TFT,
 the electrode of the second TFT is either a source electrode or a drain electrode of the second TFT,
 the first bitline and the second bitline are coupled to a first multiplexer, and
 at least one of the first TFT and the second TFT is a bottom-gated TFT.

16. The IC device according to claim 15, further comprising:
 a third bitline coupled to a S/D electrode of the first TFT of a second memory cell of the plurality of first memory cells; and
 a fourth bitline coupled to a S/D electrode of the second TFT of a second memory cell of the plurality of second memory cells,
 wherein the third bitline and the fourth bitline are coupled to a second multiplexer.

17. The IC device according to claim 15, further comprising:
 an IC die; and
 a further component, coupled to the IC die,
 wherein the IC die includes the plurality of first memory cells, the plurality of second memory cells, the wordline, the first bitline, and the second bitline.

18. The IC device according to claim 17, wherein the further component is one of a package substrate, a flexible substrate, or an interposer.

19. A method of forming an integrated circuit (IC) device, the method comprising:
 forming logic devices in a front end of line (FEOL) process on a substrate; and
 forming memory cells in a back end of line (BEOL) process, the BEOL process including
  forming a first memory cell comprising a first selector thin film transistor (TFT), and
  forming a second memory cell comprising a second selector TFT,
 wherein the second selector TFT is further away from the substrate than the first selector TFT, and
 wherein:
  a first wordline, coupled to a gate electrode of the first selector TFT is between the substrate and the gate electrode of the first selector TFT, or
  a second wordline, coupled to a gate electrode of the second selector TFT is between the substrate and the gate electrode of the second selector TFT, and wherein forming the first memory cell includes:
 forming the first wordline in a first layer over the substrate to supply a first gate signal, and
 forming the first selector TFT above the first wordline using a first thin film process, the first selector TFT having a channel layer that includes a first region and a second region,
 forming a first bitline coupled to the second region of the channel layer of the first selector TFT,
 forming a first storage node coupled to the first region of the channel layer of the first selector TFT, and
 forming a first capacitor coupled to the first storage node.

20. The method according to claim 19, wherein the BEOL process further includes interconnecting the logic devices.

21. An integrated circuit (IC) device, comprising:
 a plurality of first memory cells, each of the plurality of first memory cells comprising a first thin film transistor (TFT) in a first layer above a substrate; and
 a plurality of second memory cells, each of the plurality of second memory cells comprising a second TFT in a second layer above the substrate, wherein the first layer is between the substrate and the second layer;
 a first bitline coupled to a source/drain (S/D) electrode of the first TFT of a first memory cell of the plurality of first memory cells and to a S/D electrode of the second TFT of a first memory cell of the plurality of second memory cells, and
 a second bitline coupled to a S/D electrode of the first TFT of a second memory cell of the plurality of first memory cells and to a S/D electrode of the second TFT of a second memory cell of the plurality of second memory cells;
 wherein at least one of the first TFT and the second TFT is a bottom-gated TFT.

22. The IC device according to claim 21, further comprising:
 a first wordline coupled to a gate electrode of the first TFT of the first memory cell of the plurality of first memory cells and to a gate electrode of the first TFT of the second memory cell of the plurality of first memory cells; and
 a second wordline coupled to a gate electrode of the second TFT of the first memory cell of the plurality of second memory cells and to a gate electrode of the second TFT of the second memory cell of the plurality of second memory cells.

23. The IC device according to claim 21, further comprising:
 an IC die; and
 a further component, coupled to the IC die,
 wherein the IC die includes the plurality of first memory cells, the plurality of second memory cells, the first bitline, and the second bitline.

24. The IC device according to claim 23, wherein the further component is one of a package substrate, a flexible substrate, or an interposer.

* * * * *